(12) United States Patent
Yang et al.

(10) Patent No.: US 12,075,621 B2
(45) Date of Patent: Aug. 27, 2024

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Yuancheng Yang, Wuhan (CN); Lei Liu, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 477 days.

(21) Appl. No.: 17/459,480

(22) Filed: Aug. 27, 2021

(65) Prior Publication Data

US 2022/0384475 A1    Dec. 1, 2022

Related U.S. Application Data

(63) Continuation of application No. PCT/CN2021/096716, filed on May 28, 2021.

(51) Int. Cl.
*H10B 43/27* (2023.01)
*G11C 16/04* (2006.01)
*H10B 43/35* (2023.01)

(52) U.S. Cl.
CPC ......... *H10B 43/27* (2023.02); *G11C 16/0483* (2013.01); *H10B 43/35* (2023.02)

(58) Field of Classification Search
CPC .. H10B 43/35; H10B 41/35; H10B 20/40–65; H10B 53/20;

(Continued)

(56) References Cited

U.S. PATENT DOCUMENTS 9,679,907 B1    6/2017    Kaneko
10,290,650 B1    5/2019    Iwai
(Continued)

FOREIGN PATENT DOCUMENTS

CN    102800695 A    11/2012
CN    105390500 A    3/2016
(Continued)

OTHER PUBLICATIONS

International Search Report issued in corresponding International Application No. PCT/CN2021/096722, mailed Feb. 25, 2022, 4 pages.

(Continued)

*Primary Examiner* — Amar Movva
(74) *Attorney, Agent, or Firm* — BAYES PLLC

(57) ABSTRACT

A three-dimensional (3D) memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The channel structure includes a semiconductor channel, and a memory film over the semiconductor channel. The drain select gate line is in direct contact with the semiconductor channel, each of the plurality of word lines is in direct contact with the memory film, and the drain select gate line and the plurality of word lines include a same material.

16 Claims, 23 Drawing Sheets

(58) Field of Classification Search
CPC ........ H10B 41/20–27; H10B 43/20–27; H10B 51/20; H10B 63/84–845
See application file for complete search history.

(56) References Cited

U.S. PATENT DOCUMENTS

| | | |
|---|---|---|
| 10,720,445 B1 | 7/2020 | Shimizu et al. |
| 2008/0173933 A1 | 7/2008 | Fukuzumi et al. |
| 2016/0204122 A1 | 7/2016 | Shoji et al. |
| 2017/0229472 A1 | 8/2017 | Lu et al. |
| 2020/0395080 A1 | 12/2020 | Vishwanath et al. |
| 2021/0005617 A1 | 1/2021 | Kai et al. |
| 2021/0098490 A1 | 4/2021 | Or-Bach et al. |
| 2021/0159169 A1 | 5/2021 | Zhao et al. |

FOREIGN PATENT DOCUMENTS

| | | |
|---|---|---|
| CN | 105810639 A | 7/2016 |
| CN | 107658302 A | 2/2018 |
| CN | 107996000 A | 5/2018 |
| CN | 108695338 A | 10/2018 |
| CN | 111354738 A | 6/2020 |
| CN | 111386608 A | 7/2020 |
| CN | 111508966 A | 8/2020 |
| WO | 2021/029916 A1 | 2/2021 |

OTHER PUBLICATIONS

International Search Report issued in corresponding International Application No. PCT/CN2021/096716, mailed Mar. 4, 2022, 4 pages.

400

THREE-DIMENSIONAL MEMORY DEVICE AND METHOD FOR FORMING THE SAME

CROSS-REFERENCE TO RELATED APPLICATIONS

This application is a continuation of International Application No. PCT/CN2021/096716, filed on May 28, 2021, entitled "THREE-DIMENSIONAL MEMORY DEVICE AND METHOD FOR FORMING THE SAME," which is hereby incorporated by reference in its entirety. This application is also related to U.S. application Ser. No. 17/459,456, filed on Aug. 27, 2021, entitled "THREE-DIMENSIONAL MEMORY DEVICE AND METHOD FOR FORMING THE SAME," which is hereby incorporated by reference in its entirety.

BACKGROUND

The present disclosure relates to memory devices and methods for forming memory devices, and more particularly, to three-dimensional (3D) memory devices and methods for forming 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

In one aspect, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The channel structure includes a semiconductor channel, and a memory film over the semiconductor channel. The drain select gate line is in direct contact with the semiconductor channel, each of the plurality of word lines is in direct contact with the memory film, and the drain select gate line and the plurality of word lines include a same material.

In another aspect, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a plurality of word lines, and a source select gate line. The channel structure extends through the stack structure along a first direction and is in contact with the doped semiconductor layer. The channel structure includes a semiconductor channel, and a memory film over the semiconductor channel. The source select gate line is in direct contact with the semiconductor channel, each of the plurality of word lines is in direct contact with the memory film, and the source select gate line and the plurality of word lines include a same material.

In still another aspect, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The channel structure includes a semiconductor channel, and a memory film over the semiconductor channel. The drain select gate line is in direct contact with the semiconductor channel, each of the plurality of word lines is in direct contact with the memory film, and the drain select gate line and the plurality of word lines include a same material. The memory controller is coupled to the 3D memory device and is configured to control operations of the channel structure through the drain select gate line.

In yet another aspect, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a plurality of word lines, and a source select gate line. The channel structure extends through the stack structure along a first direction and is in contact with the doped semiconductor layer. The channel structure includes a semiconductor channel, and a memory film over the semiconductor channel. The source select gate line is in direct contact with the semiconductor channel, each of the plurality of word lines is in direct contact with the memory film, and the source select gate line and the plurality of word lines include a same material. The memory controller is coupled to the 3D memory device and is configured to control operations of the channel structure through the source select gate line.

In yet another aspect, a method for forming a 3D memory device is disclosed. A dielectric stack including a plurality of first dielectric layers and a plurality of first sacrificial layers interleaved on a doped semiconductor layer is formed. A channel structure extending vertically through the dielectric stack is formed, and the channel structure includes a semiconductor channel and a memory film covering the semiconductor channel. A first slit extending vertically in the dielectric stack is formed to remove a portion of a topmost sacrificial layer of the plurality of first sacrificial layers. The topmost sacrificial layer of the plurality of first sacrificial layers is removed to form a first cavity in the dielectric stack. A portion of sidewalls of the channel structure exposed to the first cavity is removed to expose the semiconductor channel of the channel structure to form a second cavity in the dielectric stack. A second sacrificial layer is formed in the second cavity. A second slit extending vertically in the dielectric stack is formed to expose the doped semiconductor layer. The second sacrificial layer is removed to expose the second cavity, and the plurality of first sacrificial layers are removed to form a plurality of third cavities. A drain select gate line is formed in the second cavity, and a plurality of word lines are formed in the third cavities in the dielectric stack. The drain select gate line is in direct contact with the semiconductor channel, and each of the plurality of word lines is in direct contact with the memory film.

In yet another aspect, a method for forming a 3D memory device is disclosed. A dielectric stack including a plurality of first dielectric layers and a plurality of first sacrificial layers interleaved on a doped semiconductor layer is formed. A channel structure extending vertically through the dielectric stack is formed, and the channel structure includes a semiconductor channel and a memory film covering the semiconductor channel. A first slit extending vertically in the dielectric stack is formed to expose the doped semiconductor layer. A bottommost sacrificial layer of the plurality of first sacrificial layers is removed to form a first cavity in the dielectric stack. A portion of sidewalls of the channel structure exposed to the first cavity is removed to expose the semiconductor channel of the channel structure to form a second cavity. The plurality of first sacrificial layers in the dielectric stack are removed to form a plurality of third cavities. A source select gate line is formed in the second cavity, and a plurality of word lines are formed in the third cavities in the dielectric stack. The source select gate line is in direct contact with the semiconductor channel, and each of the plurality of word lines is in direct contact with the memory film.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
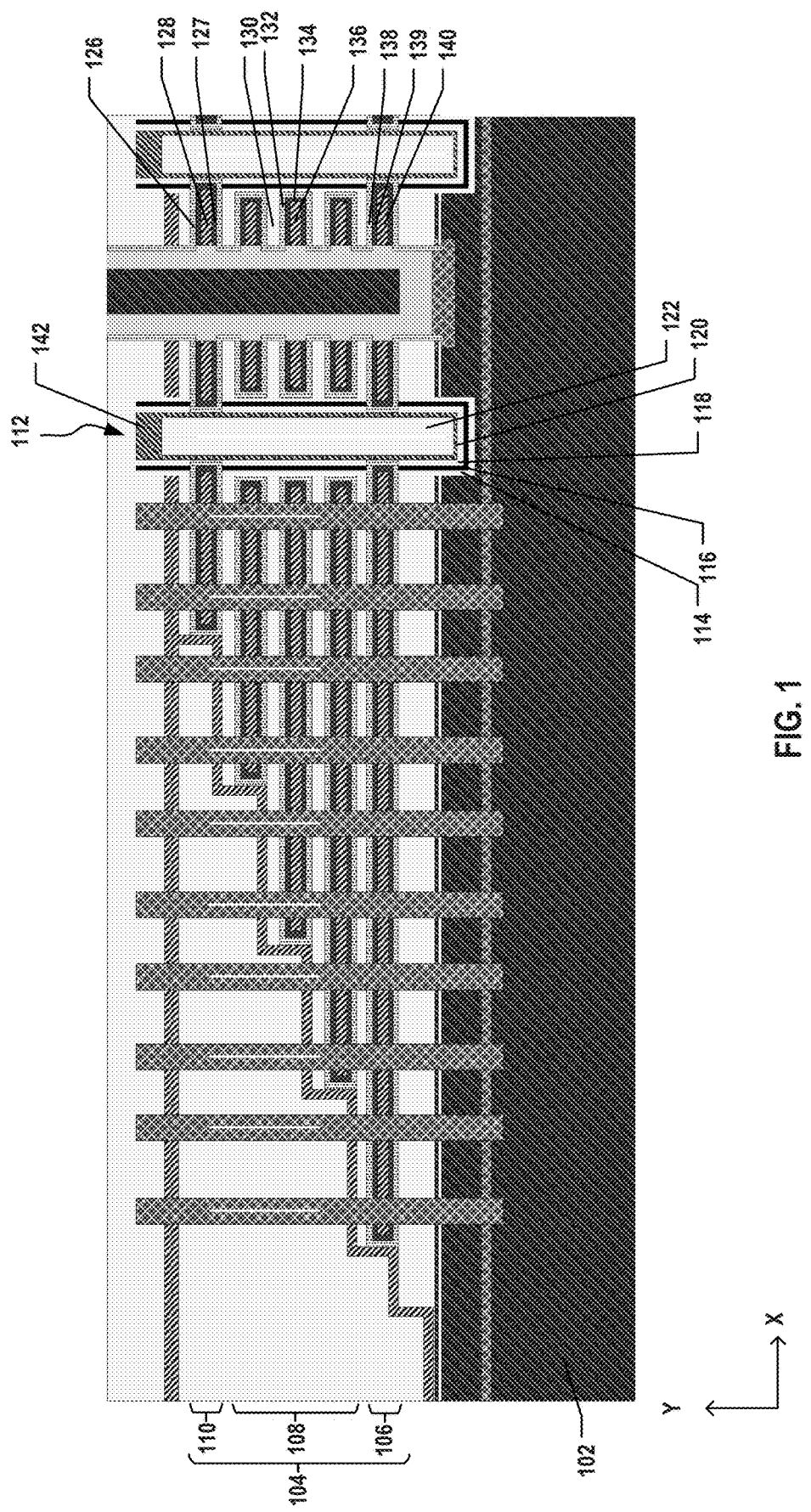
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a stack of gate electrodes may be arranged over a substrate, with a plurality of semiconductor channels through and intersecting word lines, into the implanted substrate. The bottom/lower gate electrode or electrodes function as source select gate lines, which are also called bottom select gates (BSG) in some cases. The top/upper gate electrode or electrodes function as drain select gate lines, which are also called top select gates (TSG) in some cases. The gate electrodes between the top/upper select gate electrodes and the bottom/lower gate electrodes function as word lines (WLs). The intersection of a word line and a semiconductor channel forms a memory cell.

FIG. 1 illustrates a cross-section of an exemplary 3D memory device 100, according to some aspects of the present disclosure. 3D memory device 100 may include a substrate 102, which is a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 102 is a thinned substrate (e.g., a semiconductor layer), which was thinned by grinding, etching, chemical mechanical polishing (CMP), or any combination thereof. It is noted that x and y axes are included in FIG. 1 to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationships is applied throughout the present disclosure.

3D memory device 100 may be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 may be part of a non-monolithic 3D memory device, in which components (e.g., the peripheral device and memory array device) may be formed separately on different substrates and then bonded, for example, in a face-to-face manner. In some implementations, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some implementations, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) may be a thinned substrate (which is not the substrate of the bonded non-monolithic 3D memory device), and the back-end-of-line (BEOL) interconnects of the non-monolithic 3D memory device may be formed on the backside of the thinned memory array device substrate.

In some implementations, 3D memory device 100 is a NAND Flash memory device in which memory cells are provided in the form of an array of NAND memory strings each extending vertically above substrate 102. As shown in FIG. 1, 3D memory device 100 may include a stack structure 104 (e.g., a memory stack) formed on substrate 102, and NAND memory string may include a channel structure 112 extending vertically through stack structure 104 in the y-direction. Stack structure 104 includes interleaved conductive layers and dielectric layers 130, and the conductive layers may include at least one source select gate line 106, a plurality of word lines 108, and at least one drain select gate line 110.

Channel structure 112 may include a channel hole filled with semiconductor materials (e.g., as a semiconductor channel 120) and dielectric materials (e.g., as a memory film). In some implementations, semiconductor channel 120 includes silicon, such as amorphous silicon, polysilicon, or single crystalline silicon. In some implementations, the memory film is a composite layer including a tunneling layer 118, a storage layer 116 (also known as a "charge trap layer"), and a blocking layer 114. In some implementations, the remaining space of channel structure 112 may be partially or fully filled with a filling layer 122 including dielectric materials, such as silicon oxide. Channel structure 112 may have a cylinder shape (e.g., a pillar shape). Filling layer 122, semiconductor channel 120, tunneling layer 118, storage layer 116, and blocking layer 114 are arranged radially from the center toward the outer surface of the pillar in this order, according to some implementations. Tunneling layer 118 may include silicon oxide, silicon oxynitride, or any combination thereof. Storage layer 116 may include silicon nitride, silicon oxynitride, silicon, or any combination thereof. Blocking layer 114 may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

In some implementations, NAND memory string may further include a channel contact (not shown), or called semiconductor plug, in a lower portion (e.g., at the lower end) of NAND memory string below channel structure 112. As used herein, the "upper end" of a component (e.g., NAND memory string) is the end farther away from substrate 102 in the y-direction, and the "lower end" of the component (e.g., NAND memory string) is the end closer to substrate 102 in the y-direction when substrate 102 is positioned in the lowest plane of 3D memory device 100. The channel contact may include a semiconductor material, such as silicon, which is epitaxially grown from substrate 102 in any suitable directions. It is understood that in some implementations, the channel contact includes single crystalline silicon, the same material as substrate 102. In other words, the channel contact may include an epitaxially-grown semiconductor layer that is the same as the material of substrate 102. In some implementations, part of the channel contact is above the top surface of substrate 102 and in contact with semiconductor channel 120. The channel contact may function as a channel controlled by a source select gate of the NAND memory string. It is understood that in some implementations, 3D memory device 100 does not include the channel contact, as shown in FIG. 1.

In some implementations, the NAND memory string further includes a channel plug 142 in an upper portion (e.g., at the upper end) of the NAND memory string. Channel plug 142 may be in contact with the upper end of semiconductor channel 120. Channel plug 142 may include semiconductor materials (e.g., polysilicon). By covering the upper end of channel structure 112 during the fabrication of 3D memory device 100, channel plug 142 may function as an etch stop layer to prevent etching of dielectrics filled in channel structure 112, such as silicon oxide and silicon nitride. In some implementations, channel plug 142 also functions as the drain of the NAND memory string. It is understood that in some implementations, 3D memory device 100 does not include channel plug 142.

The memory array device may include NAND memory strings that extend through stack structure 104. Stack structure 104 includes interleaved conductive layers and dielectric layers 130, and the stacked conductive/dielectric layer pairs are also referred to as a memory stack. In some implementations, a pad oxide layer is formed between substrate 102 and stack structure 104. The number of the conductive/dielectric layer pairs in stack structure 104 determines the number of memory cells in 3D memory device 100. The conductive layers may include at least one source select gate line 106, a plurality of word lines 108, and at least one drain select gate line 110. Source select gate line 106 may be the one or more than one bottom/lower conductive layers and may function as source select gate lines, which are also called bottom select gates (BSG) in some cases. Drain select gate line 110 may be the one or more than one top/upper conductive layers and may function as drain select gate lines, which are also called top select gates (TSG) in some cases. The conductive layers between source select gate line 106 and drain select gate line 110 may be word lines 108.

Word lines 108 may include conductive materials including, but not limited to, tungsten (W), cobalt (Co), copper (Cu), aluminum (Al), polysilicon, doped silicon, silicides, or any combination thereof. Dielectric layers 130 may include dielectric materials including, but not limited to, silicon oxide, silicon nitride, silicon oxynitride, or any combination thereof.

In some implementations, each word line 108 in stack structure 104 functions as a gate conductor of memory cells in the NAND memory string. Word lines 108 may extend laterally coupling a plurality of memory cells. In some implementations, memory cell transistors in NAND memory string include semiconductor channel 120, memory film (including tunneling layer 118, storage layer 116, and blocking layer 114), a gate conductor 136 made from tungsten, adhesion layers 134 including titanium/titanium nitride (Ti/TiN) or tantalum/tantalum nitride (Ta/TaN), gate dielectric layers 132 made from high-k dielectric materials, and channel structure 112. As shown in FIG. 1, gate dielectric layers 132 contact blocking layer 114 of channel structure 112.

Drain select gate line 110 may include a conductor layer 128 made from tungsten, an adhesion layer 127 including titanium/titanium nitride (Ti/TiN) or tantalum/tantalum nitride (Ta/TaN), and a dielectric layer 126 made from high-k dielectric materials. As shown in FIG. 1, dielectric layer 126 directly contacts channel structure 112. Specifically, dielectric layer 126 directly contacts semiconductor channel 120 of channel structure 112. Adhesion layer 127 locates inside and in contact with dielectric layer 126, and conductor layer 128 locates inside and in contact with adhesion layer 127. Conductor layer 128, adhesion layer 127 and dielectric layer 126 collectively form drain select gate line 110.

Source select gate line 106 may include a conductor layer 140 made from tungsten, an adhesion layer 139 including titanium/titanium nitride (Ti/TiN) or tantalum/tantalum nitride (Ta/TaN), and a dielectric layer 138 made from high-k dielectric materials. As shown in FIG. 1, dielectric layer 138 directly contacts channel structure 112. Specifically, dielectric layer 138 directly contacts semiconductor channel 120 of channel structure 112. Adhesion layer 139 locates inside and in contact with dielectric layer 138, and conductor layer 140 locates inside and in contact with adhesion layer 139. Conductor layer 140, adhesion layer 139, and dielectric layer 138 collectively form source select gate line 106.

It is understood that, in some implementations, 3D memory device 100 may include both source select gate line 106 and drain select gate line 110. In some implementations, 3D memory device 100 may only include source select gate line 106. In some further implementations, 3D memory device 100 may only include drain select gate line 110. In some further implementations, 3D memory device 100 may further include the channel contact in a lower portion of the NAND memory string below channel structure 112, and source select gate line 106 may contact the channel contact.

In some implementations, gate dielectric layers 132, dielectric layer 126, and dielectric layer 138 are formed in stack structure 104 during a same process. Therefore, gate dielectric layers 132, dielectric layer 126, and dielectric layer 138 may have a same thickness, and gate dielectric layers 132, dielectric layer 126, and dielectric layer 138 may be formed by a same material.

In some implementations, adhesion layers 134, adhesion layer 127, and adhesion layer 139 are formed in stack structure 104 during a same process. Therefore, adhesion layers 134, adhesion layer 127, and adhesion layer 139 may have a same thickness, and adhesion layers 134, adhesion layer 127, and adhesion layer 139 may be formed by a same material.

In some implementations, gate conductor 136, conductor layer 128, and conductor layer 140 are formed in stack structure 104 during a same process. Therefore, gate conductor 136, conductor layer 128, and conductor layer 140 may be formed by a same material.

In the situation that drain select gate line 110 or source select gate line 106 contacts sidewalls of blocking layer 114, the threshold voltage (Vt) of the TSG transistor or the BSG transistor may have a shift in some working modes or under some voltage arrangements. For example, if a high voltage applied to the NAND memory string or the memory device is operated at a high temperature during the program/erase cycling, the threshold voltage (Vt) of the TSG transistor or the BSG transistor may have a shift. By removing a portion of the memory film on sidewalls of channel structure 112 to form drain select gate line 110 or source select gate line 106, the TSG transistor or the BSG transistor may function as a regular metal—oxide—semiconductor field-effect transistor (MOSFET), and the induced threshold voltage (Vt) shift of TSG transistor or the BSG transistor can be prevented.

In some implementations, drain select gate line 110 and source select gate line 106 may be both formed directly contacting semiconductor channel 120. In some implementations, one of drain select gate line 110 and source select gate line 106 may be formed directly contacting semiconductor channel 120. Furthermore, after removing a portion of the memory film on sidewalls of channel structure 112, word lines 108, drain select gate line 110, and source select gate line 106 may be formed together during the same processes, and the manufacturing process and cost may be reduced as well.

FIGS. 2-20 illustrate cross-sections of 3D memory device 100 at different stages of a manufacturing process, according to some aspects of the present disclosure. FIG. 21 illustrates a flowchart of an exemplary method 200 for forming 3D memory device 100, according to some aspects of the present disclosure. For the purpose of better describing the present disclosure, the cross-sections of 3D memory device 100 in FIGS. 2-20 and method 200 in FIG. 21 will be discussed together. It is understood that the operations shown in method 200 are not exhaustive and that other operations may be performed as well before, after, or between any of the illustrated operations. Further, some of the operations may be performed simultaneously, or in a different order than shown in FIGS. 2-20 and FIG. 21.

Figure 2:
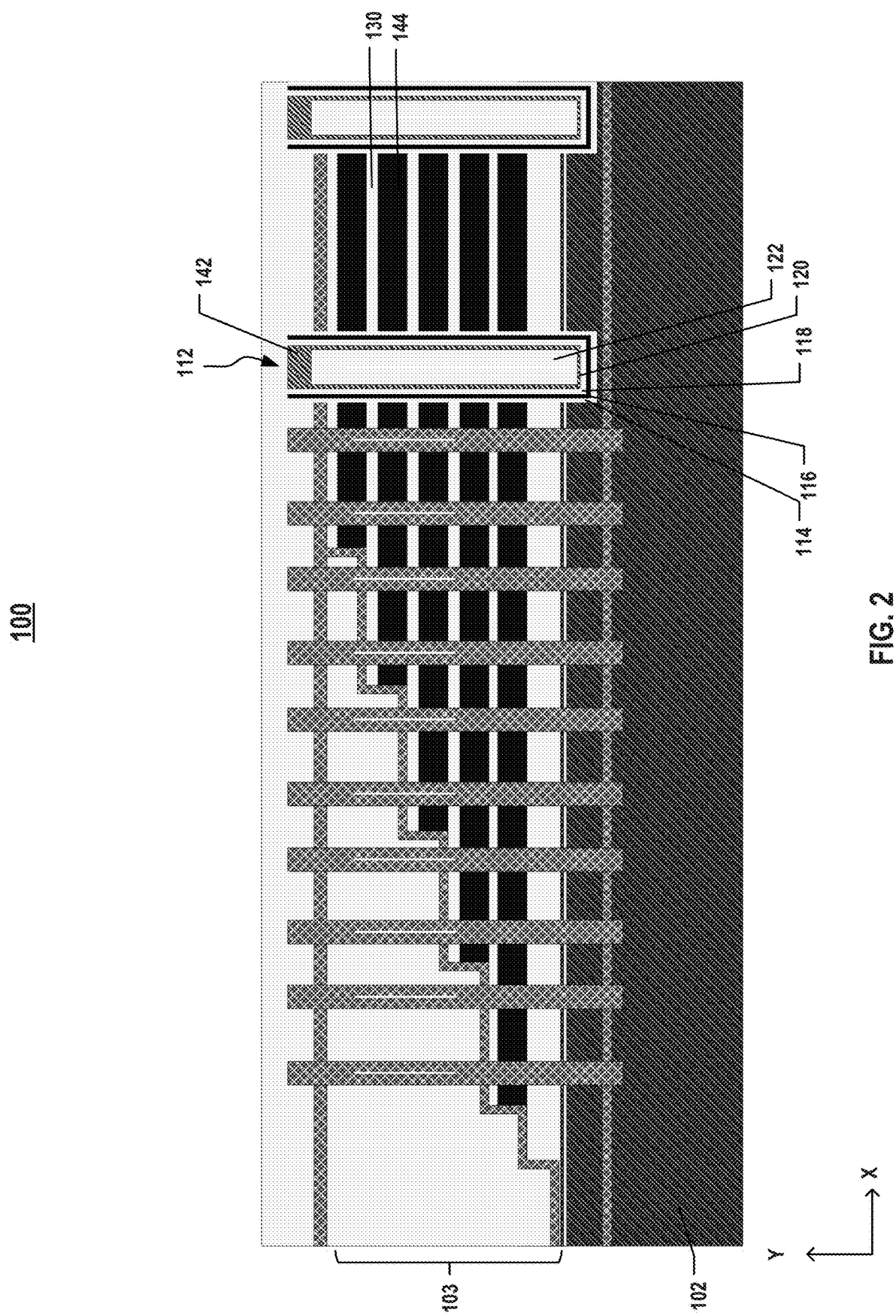
FIGS. 2-20 illustrate cross-sections of an exemplary 3D memory device at different stages of a manufacturing process, according to some aspects of the present disclosure.

As shown in FIG. 2 and operation 202 of FIG. 21, a dielectric stack 103 including a plurality of dielectric/sacrificial layer pairs is formed on substrate 102. In some implementations, substrate 102 may be a doped semiconductor layer. The dielectric/sacrificial layer pairs include interleaved dielectric layers 130 and sacrificial layers 144 extending in the x-direction. In some implementations, each dielectric layer 130 may include a layer of silicon oxide, and each sacrificial layer 144 may include a layer of silicon nitride. Dielectric stack 103 may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between substrate 102 and dielectric stack 103 by depositing dielectric materials, such as silicon oxide, on substrate 102.

Channel structure 112 is formed extending vertically through dielectric stack 103 in they-direction, as shown in operation 204 of FIG. 21. In some implementations, an etch process may be performed to form a channel hole in dielectric stack 103 that extends vertically through the interleaved dielectric/sacrificial layers. In some implementations, fabrication processes for forming the channel hole may include wet etching and/or dry etching, such as deep reactive ion etching (DRIE). In some implementations, the channel hole may extend further into the top portion of substrate 102. The etch process through dielectric stack 103 may not stop at the top surface of substrate 102 and may continue to etch part of substrate 102. After the formation of the channel hole, an epitaxial operation, e.g., a selective epitaxial growth operation, may be performed to form the channel contact on the bottom of the channel hole. Then, the memory film, including tunneling layer 118, storage layer 116, and blocking layer 114, and semiconductor channel 120 can be formed on the channel contact. In some implementations, channel structure 112 may not include the channel contact, as shown in FIG. 2.

Figure 3:
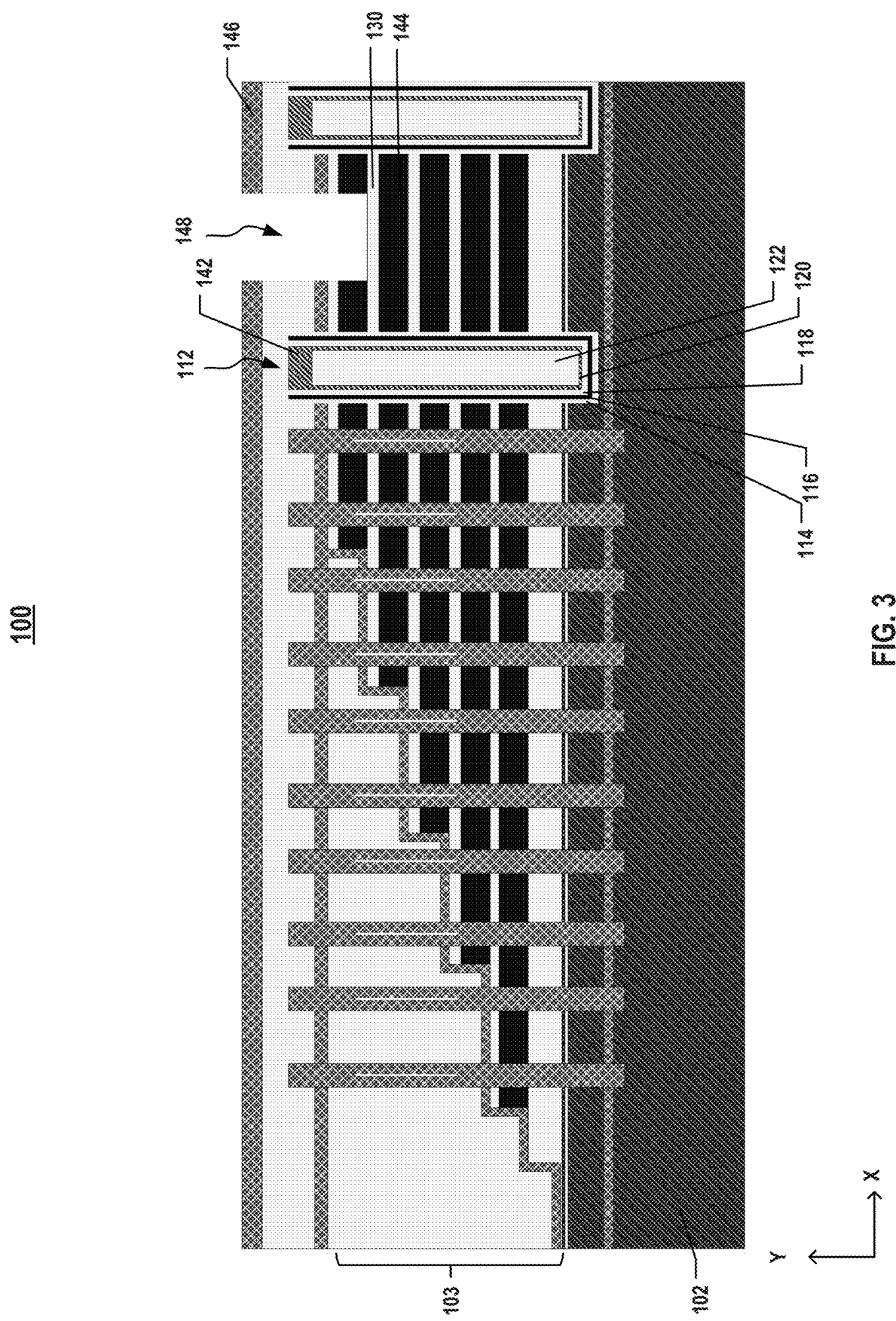

As shown in FIG. 3 and operation 206 of FIG. 21, a first slit 148 extending vertically in dielectric stack 103 is formed by removing a portion of a topmost layer of sacrificial layers 144. As shown in FIG. 3, a hard mask 146 is formed on dielectric stack 103, and then a lithography process and an etch process may be performed in hard mask 146 and dielectric stack 103 to form first slit 148. First slit 148 may be formed to expose the topmost one layer or the topmost multiple layers of sacrificial layers 144 depending on the design of the TSG of 3D memory device 100. In some implementations, the etch process for removing the portion of dielectric stack 103 may include a plurality of etch processes alternatingly removing the silicon oxide layers and the silicon nitride layers.

Figure 4:
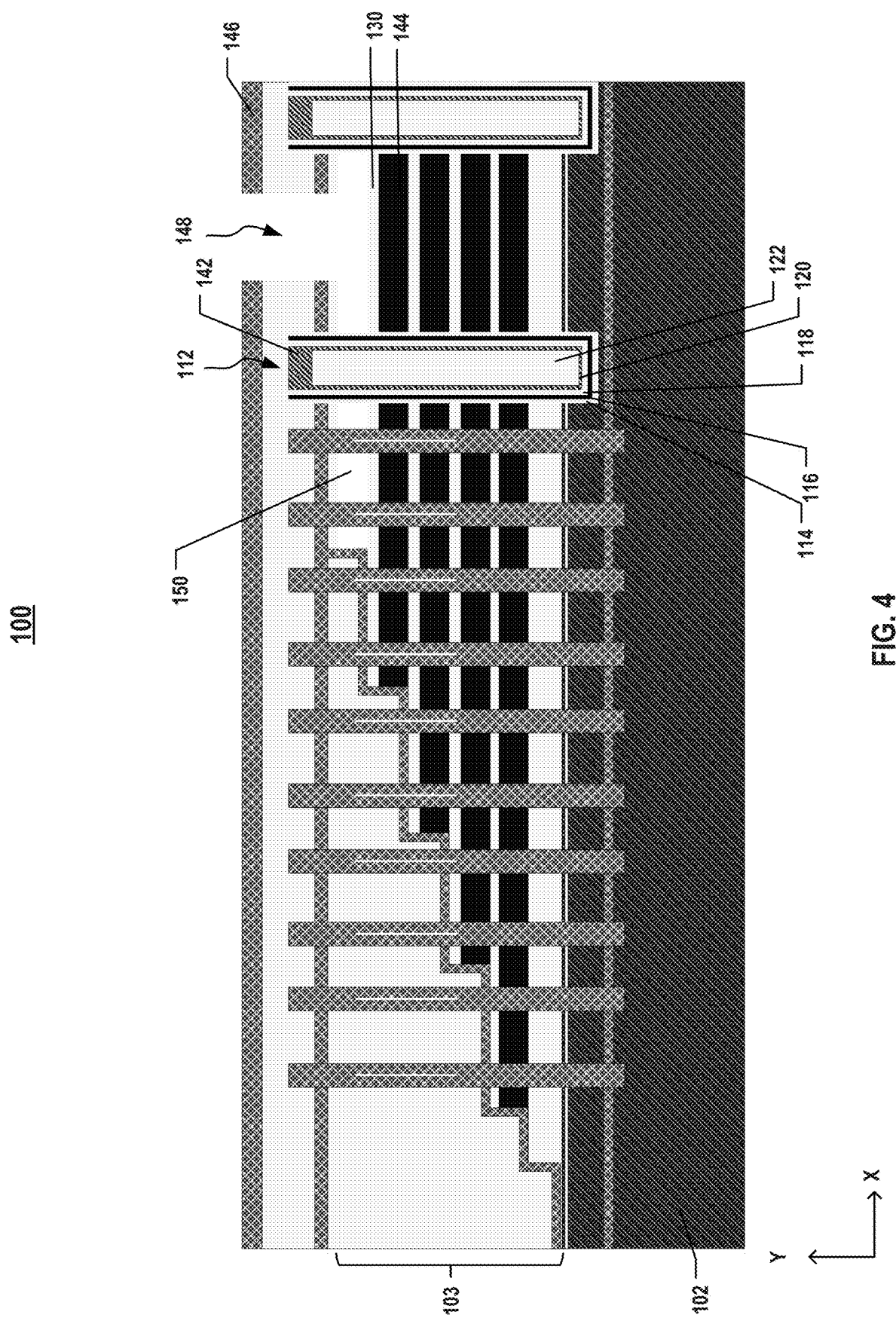
Figure 5:
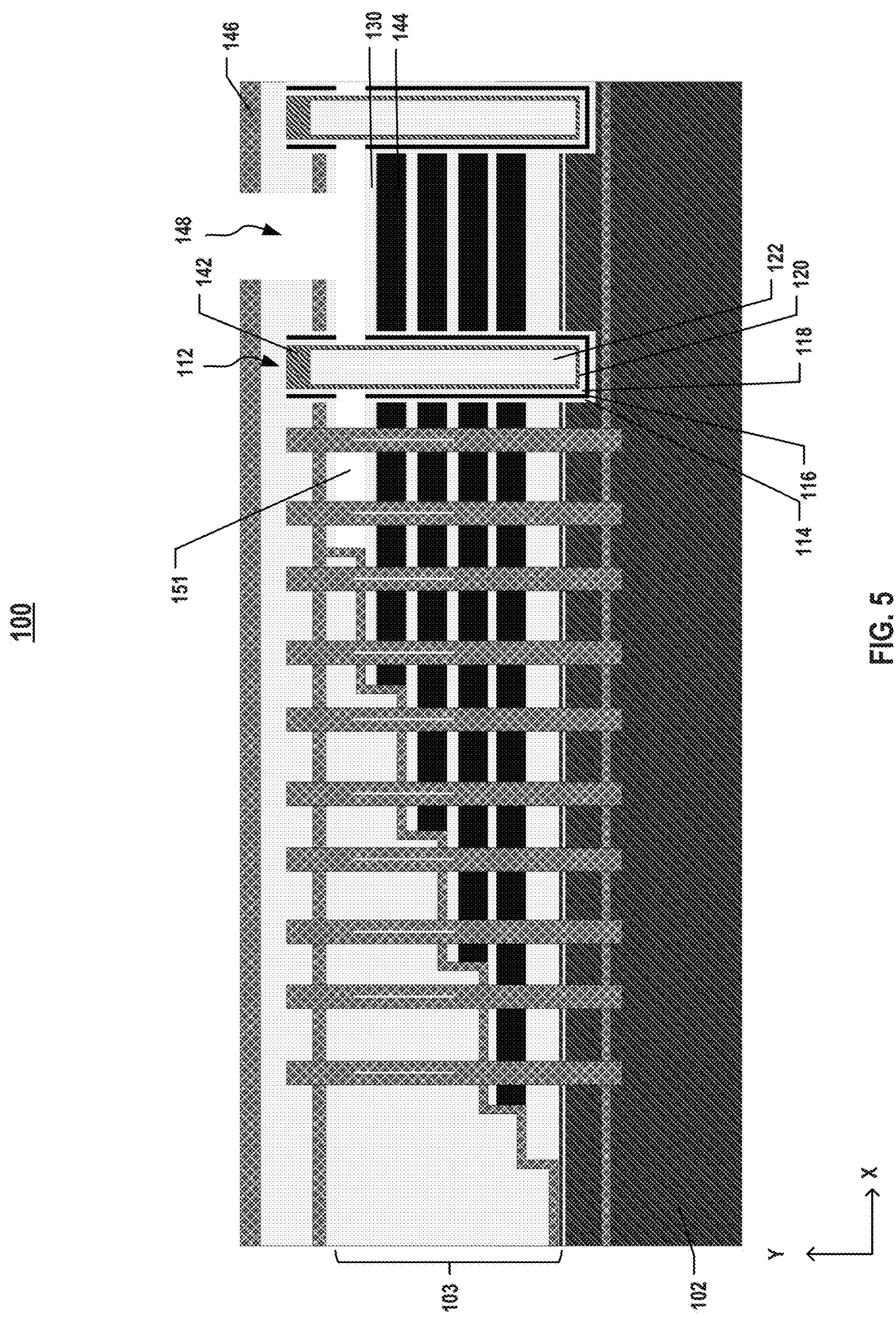

As shown in FIG. 4 and operation 208 of FIG. 21, the topmost layer of sacrificial layers 144 is removed to form a cavity 150 in dielectric stack 103. In some implementations, the topmost layer of sacrificial layers 144 is a silicon nitride layer and may be removed by wet etch, dry etch, or other suitable processes. Then, as shown in FIG. 5 and operation 210 of FIG. 21, a portion of sidewalls of channel structure 112 is removed. Specifically, the memory film portion, including tunneling layer 118, storage layer 116, and blocking layer 114, on sidewalls of channel structure 112 exposed to cavity 150 is removed until exposing semiconductor channel 120 to form a cavity 151. In some implementations, tunneling layer 118, storage layer 116, and blocking layer 114, on sidewalls of channel structure 112 exposed to cavity 150 may be removed by wet etch, dry etch, or other suitable processes.

Figure 6:
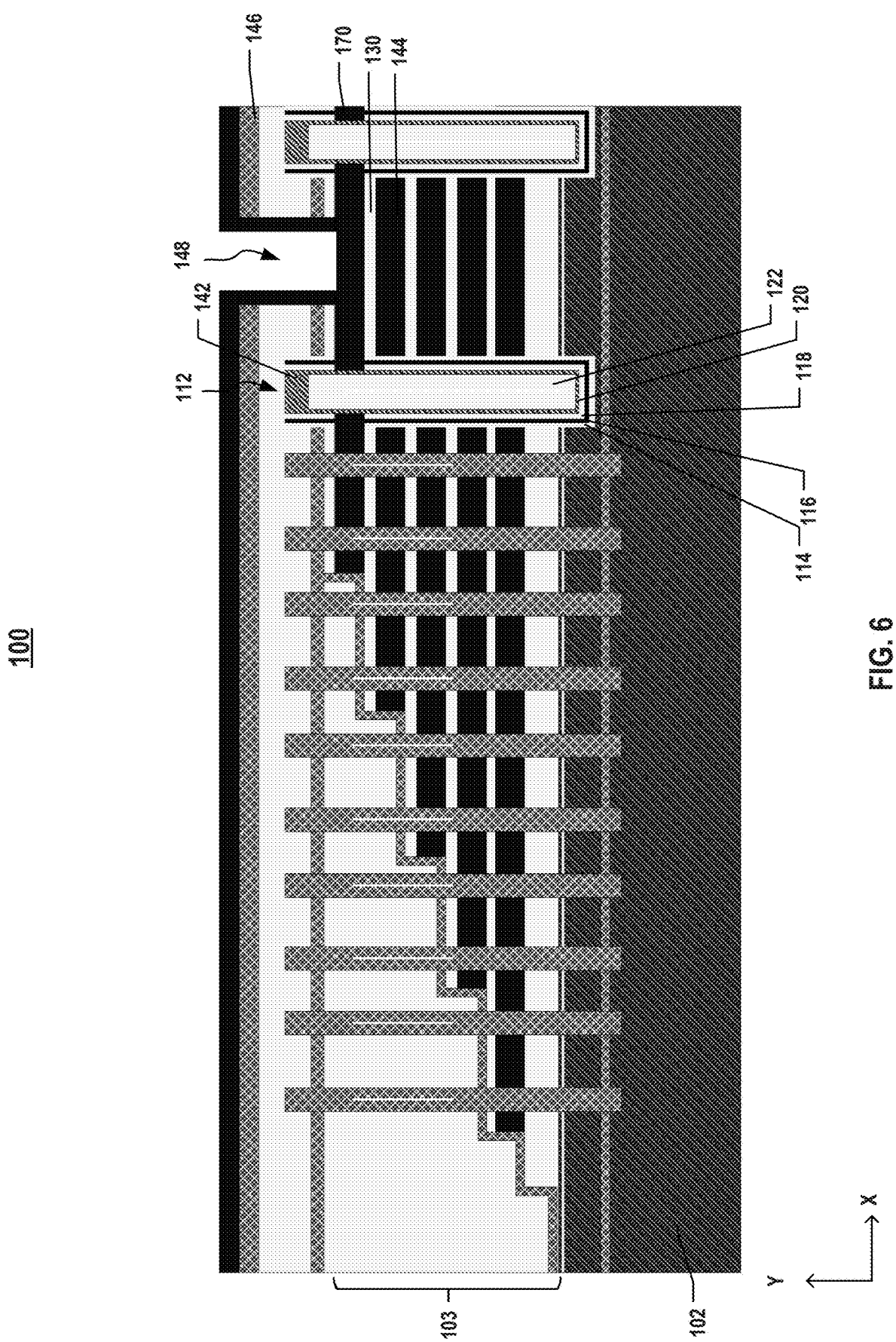

As shown in FIG. 6 and operation 212 of FIG. 21, a second sacrificial layer 170 is formed in cavity 151, on sidewalls of slit 148, and on the top surface of hard mask 146. In some implementations, second sacrificial layer 170 may be formed by the same material of sacrificial layers 144. In some implementations, second sacrificial layer 170 is a silicon nitride layer. In some implementations, second sacrificial layer 170 may be formed by formed by ALD, PVD, CVD, or other suitable processes. Since a portion of the memory film is removed during operation 210, second sacrificial layer 170 directly contacts semiconductor channel 120.

Figure 7:
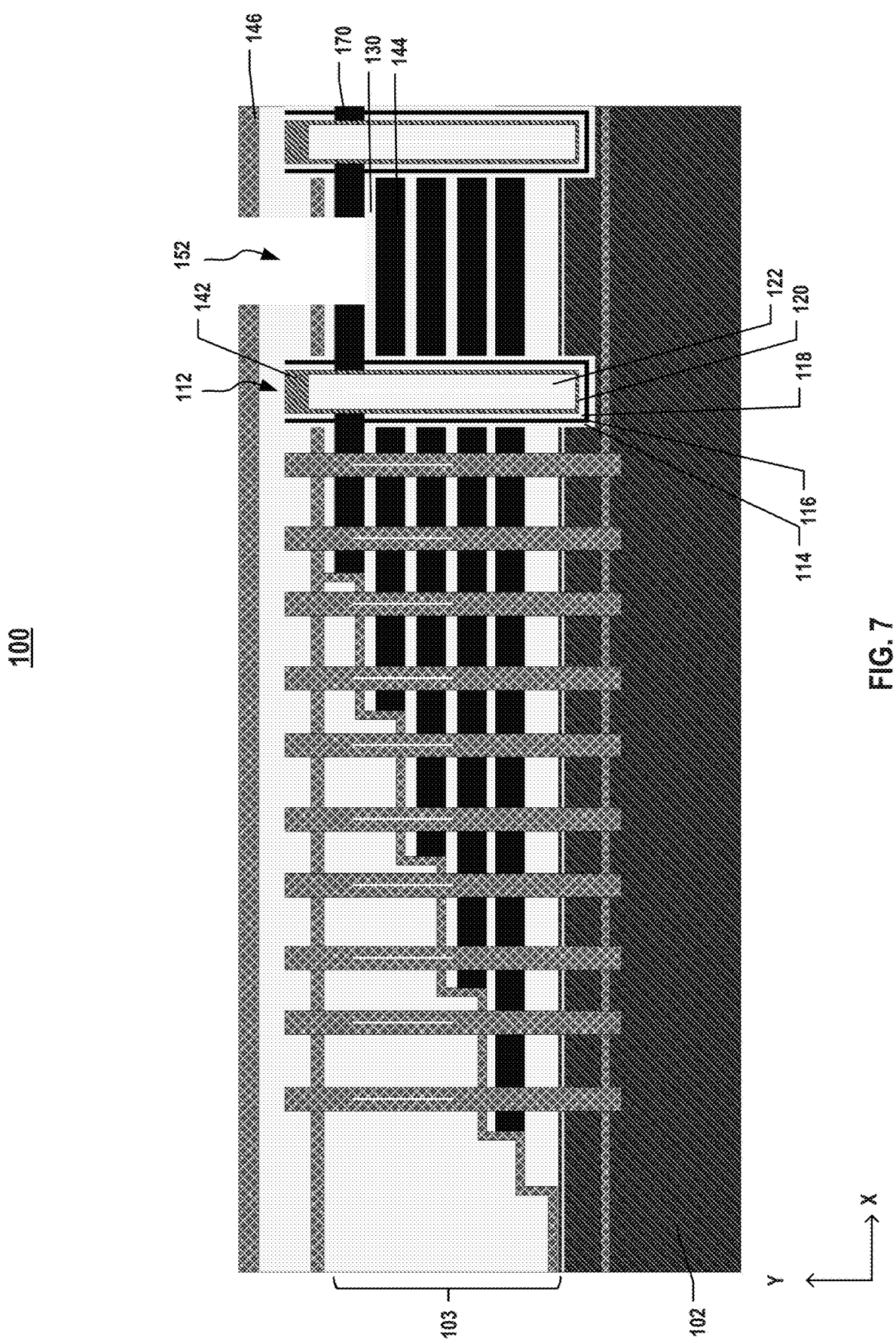
Figure 8:
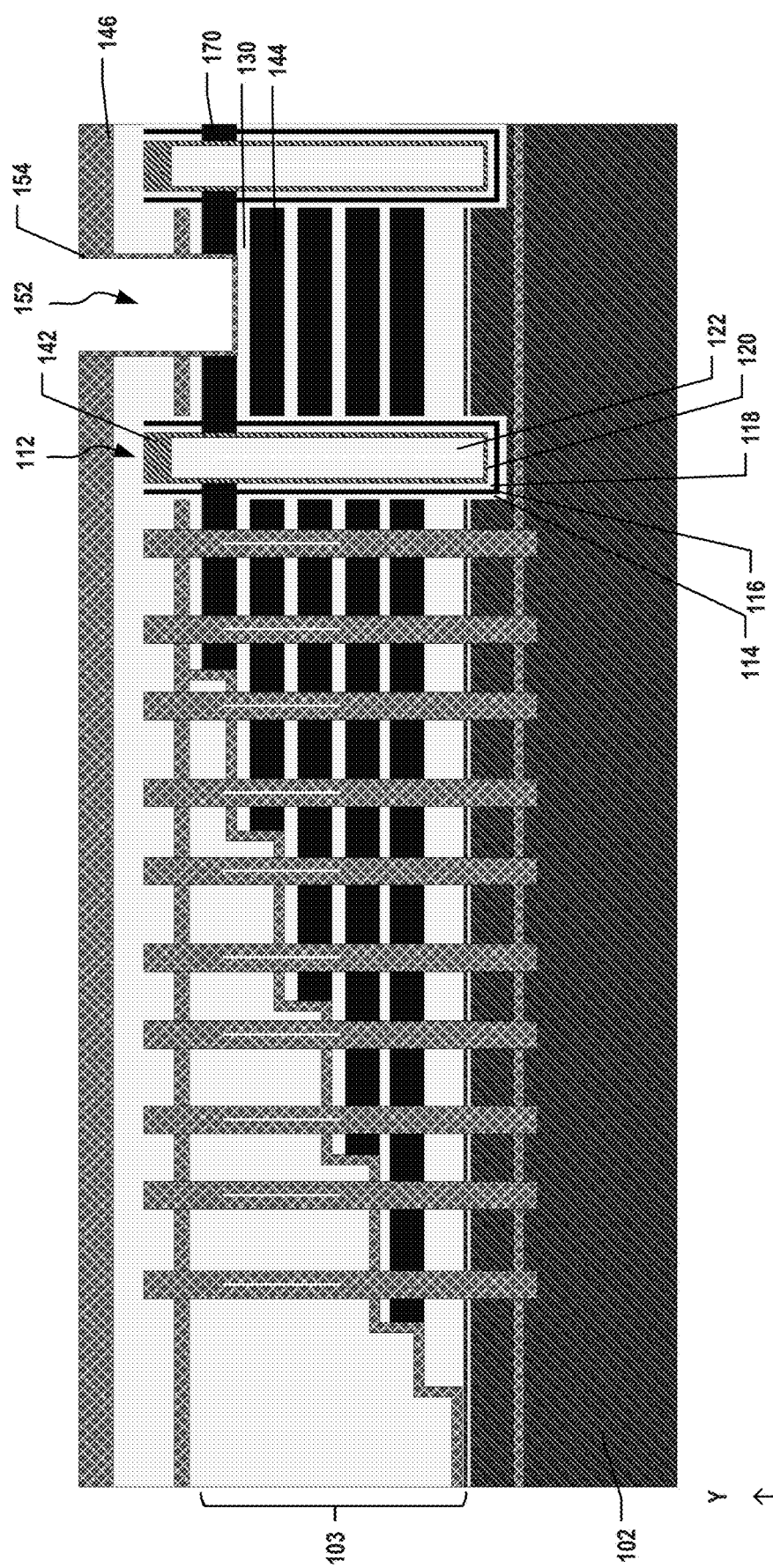
Figure 9:
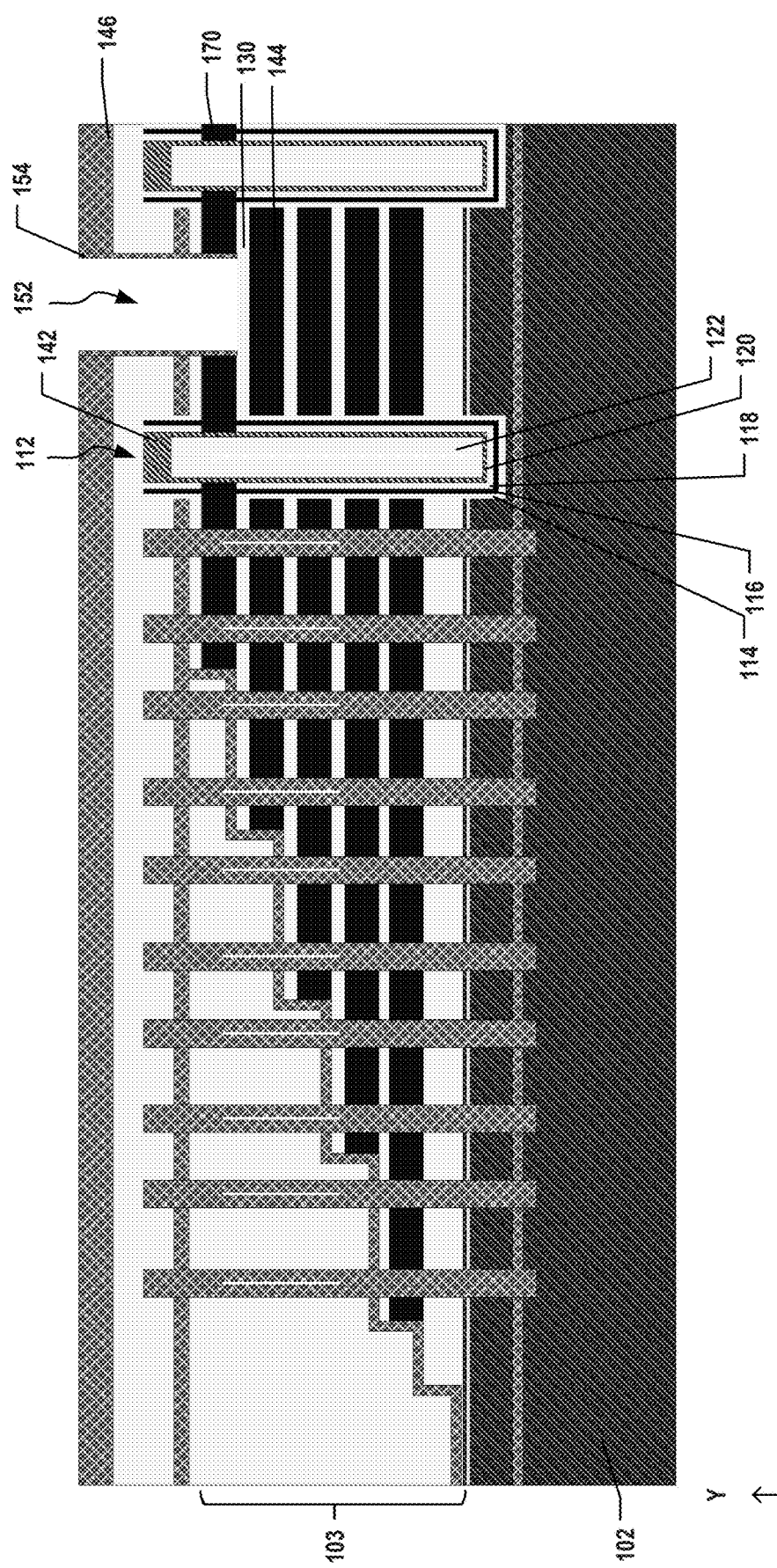

In operation 214 of FIG. 21, a second slit 152 extending vertically in dielectric stack 103 is formed to expose substrate 102. In some implementations, the formation of second slit 152 may include multiple etch and lithography operations, as shown in FIGS. 7-13. As shown in FIG. 7, second sacrificial layer 170 on the sidewalls of first slit 148 and on dielectric stack 103 are removed first. After the removal of second sacrificial layer 170 on the sidewalls of first slit 148, second slit 152 is formed. For the purpose of better describing the present disclosure, second slit 152 is used here to describe the opening after the removal of second sacrificial layer 170 on the sidewalls of first slit 148, and second slit 152 may be extended in the subsequential operations. Then, as shown in FIG. 8, a spacer hard mask 154 is formed on the bottom and the sidewalls of second slit 152. As shown in FIG. 9, spacer hard mask 154 on the bottom of second slit 152 is then removed.

Figure 10:
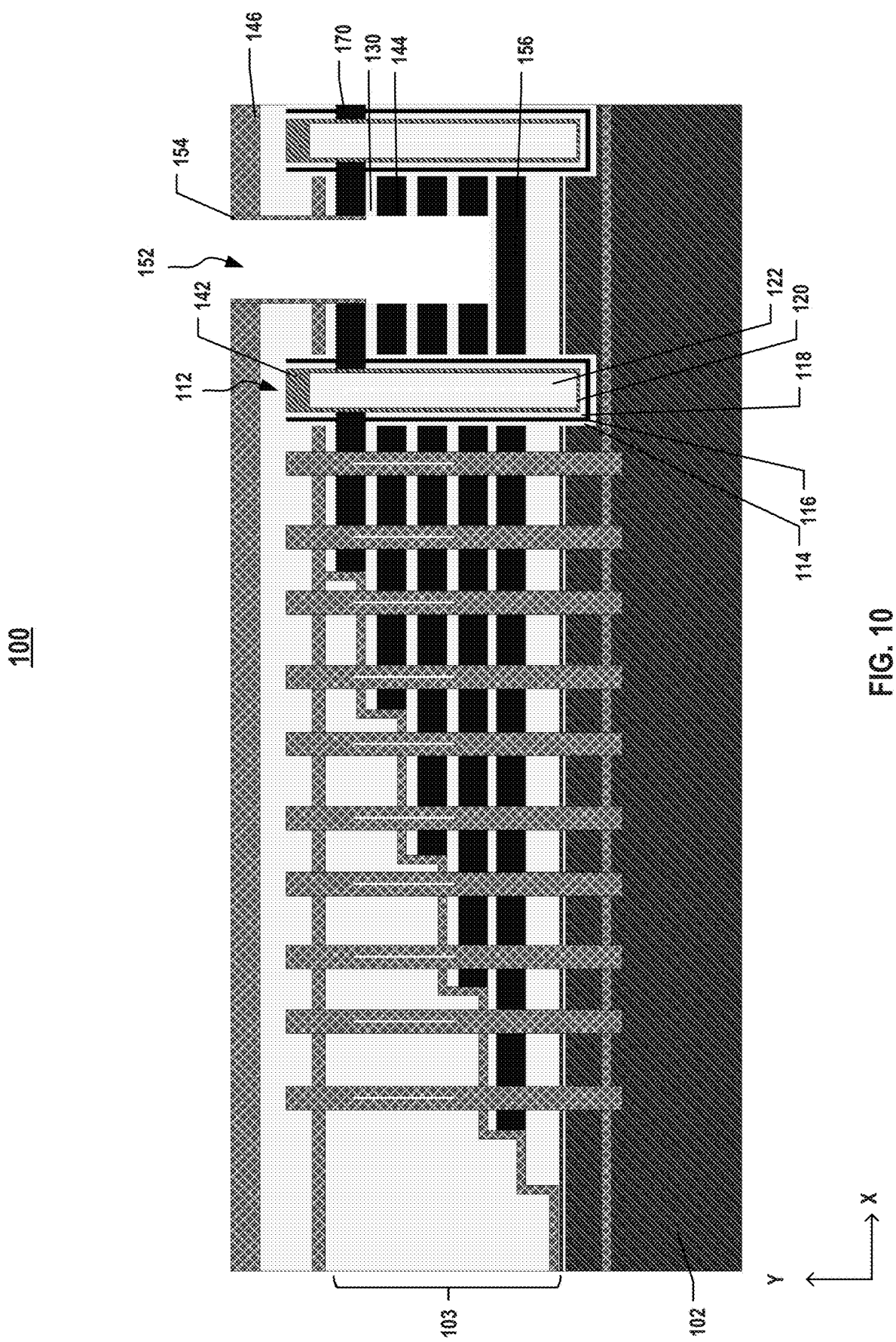
Figure 11:
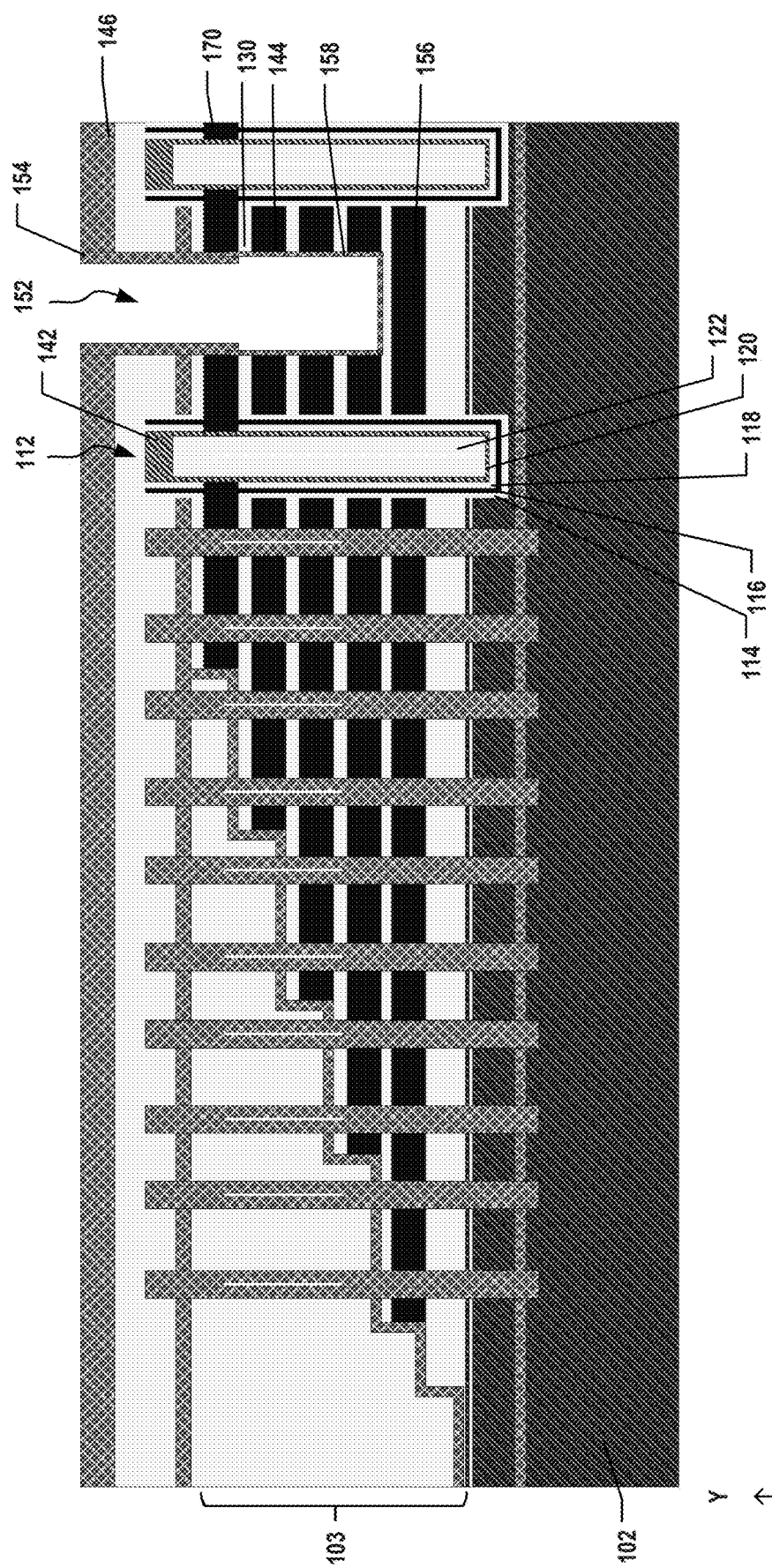
Figure 12:
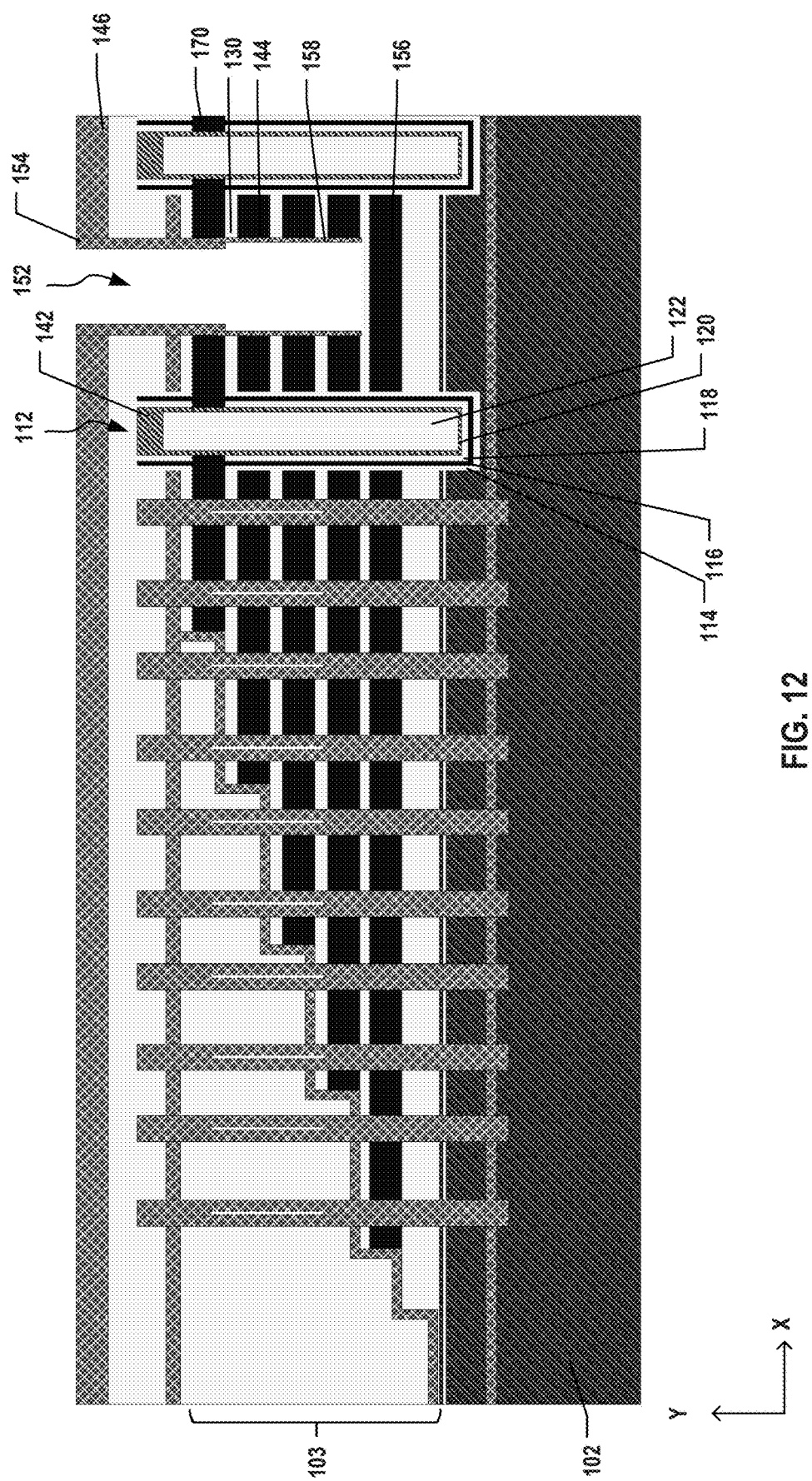

Another etch process is performed to remove a portion of the interleaved dielectric/sacrificial layers beneath second sacrificial layer 170 until the dielectric layer above the bottommost sacrificial layer 156, as shown in FIG. 10. Spacer hard mask 154 on the sidewalls of second slit 152 may protect second sacrificial layer 170 during the etch process, and second slit 152 is extended after the etch process. In some implementations, the etch process for removing the portion of the interleaved dielectric/sacrificial layers may include a plurality of etch processes alternatingly removing the silicon oxide layers and the silicon nitride layers. The exposed sacrificial layers 144 are the layers that will be removed and replaced by the word lines in later operations. As shown in FIG. 11, another spacer hard mask 158 may be formed on the bottom and the sidewalls of second slit 152. The portion of spacer hard mask 158 on the bottom of second slit 152 is removed, as shown in FIG. 12.

Figure 13:
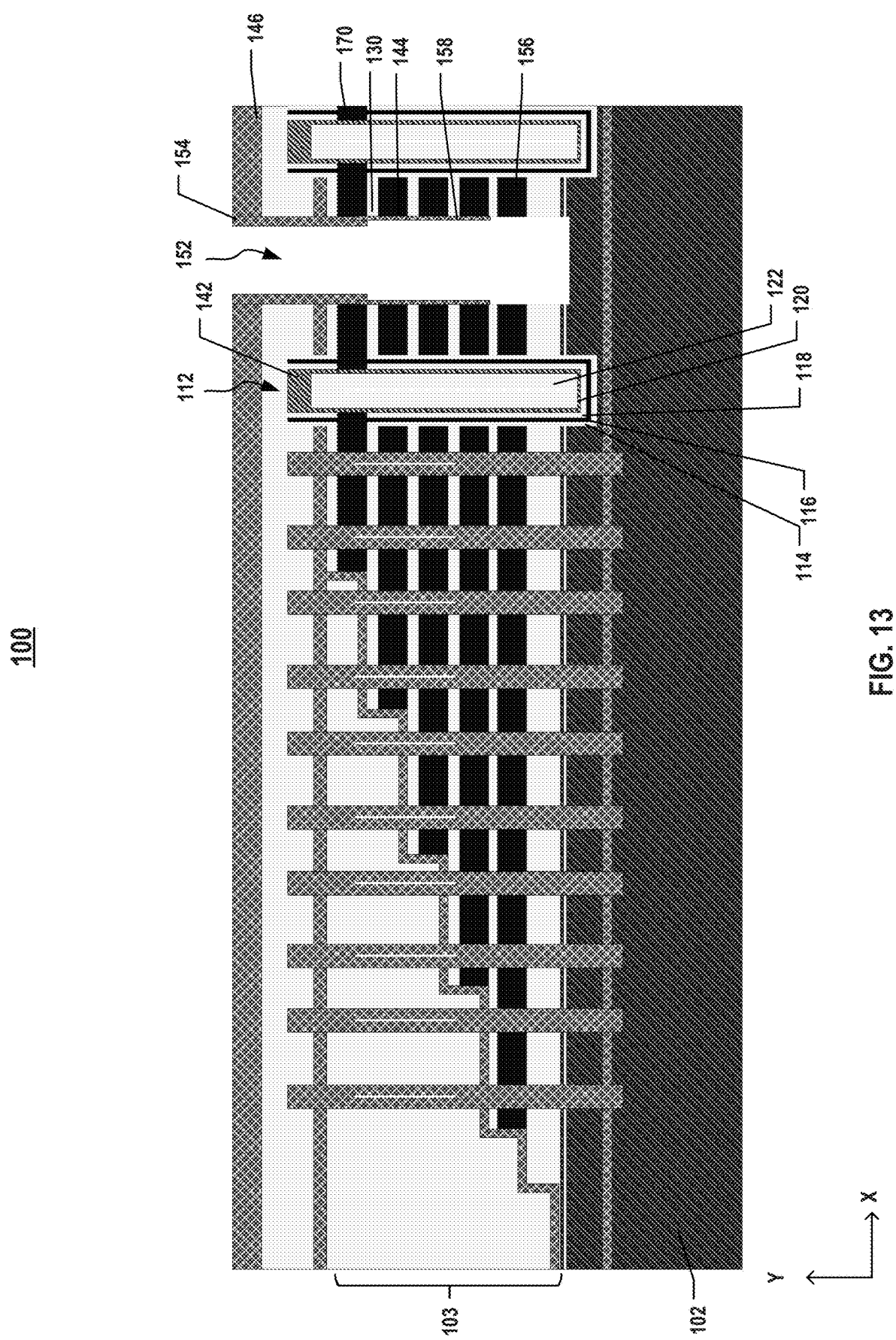

As shown in FIG. 13, a further etch process may be performed to remove a portion of sacrificial layer 156 and the dielectric layers 130 until exposing substrate 102. Spacer hard mask 154 and spacer hard mask 158 may protect second sacrificial layer 170 and the interleaved dielectric/sacrificial layers during the etch process. In some implementations, the etch process for removing the portion of sacrificial layer 156 and the dielectric layer 130 may include a plurality of etch processes alternatingly removing the silicon oxide layers and the silicon nitride layers.

Figure 14:
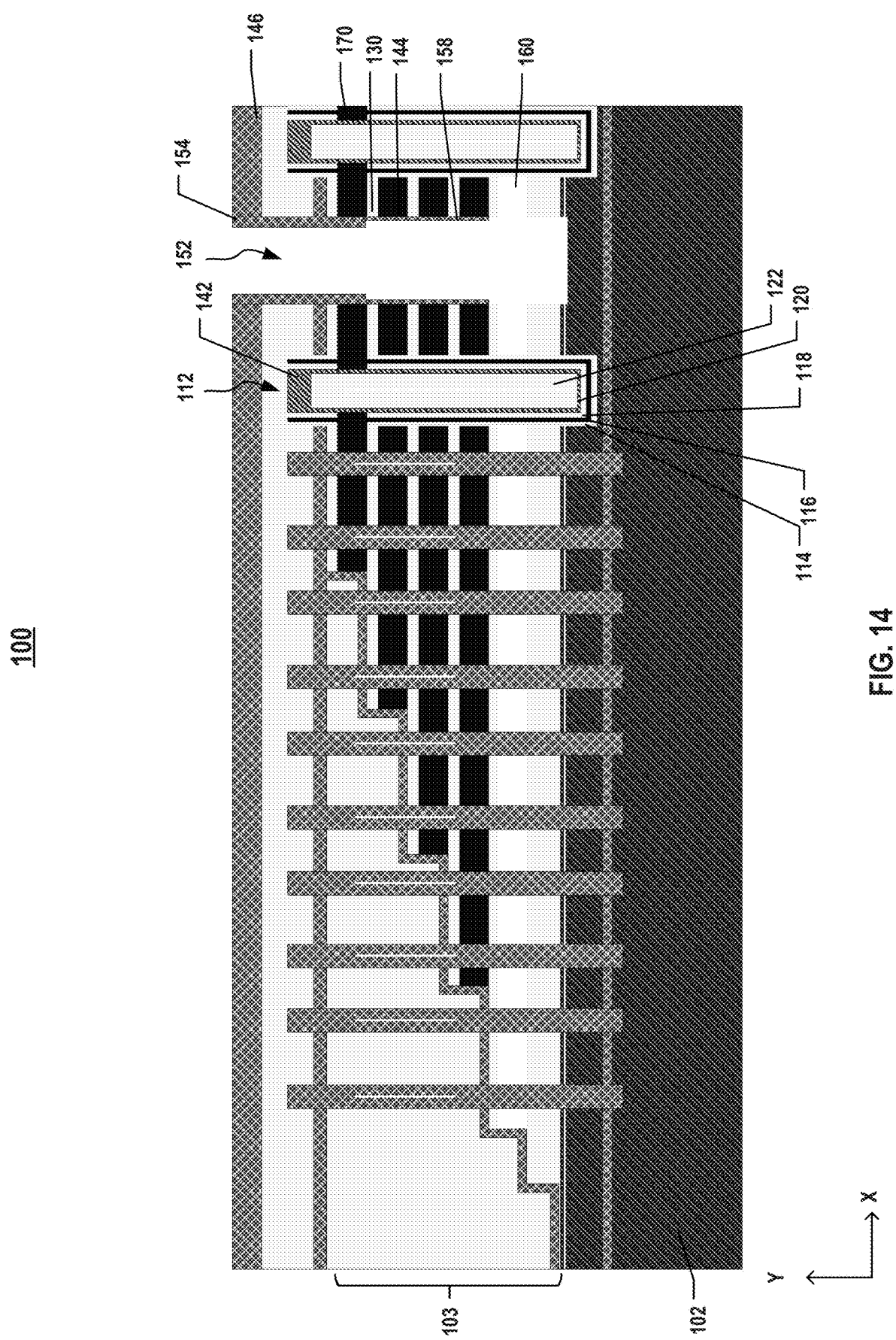
Figure 15:
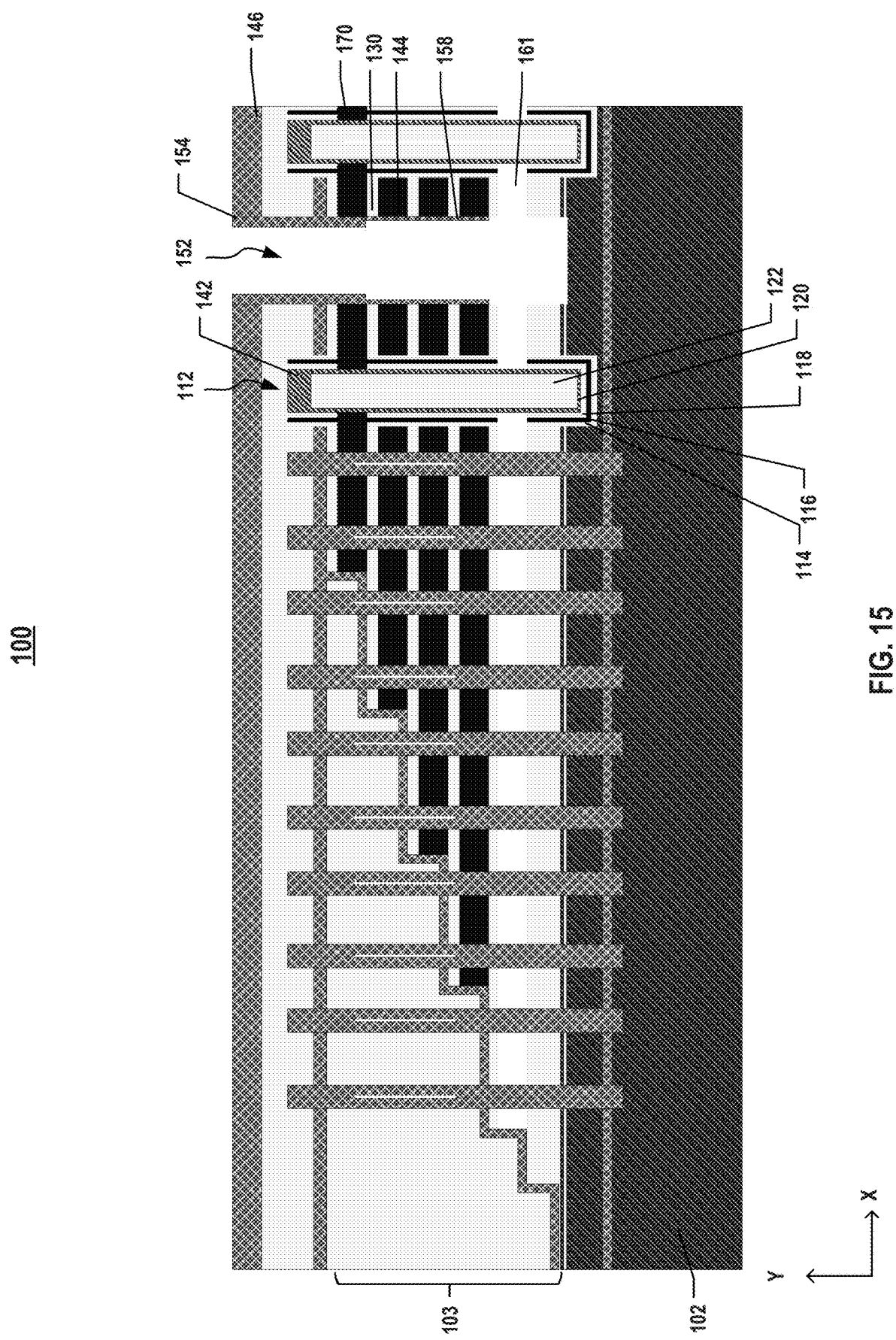

As shown in FIG. 14, sacrificial layer 156 is removed to form a cavity 160 in dielectric stack 103 to expose channel structure 112. In some implementations, sacrificial layer 156 is a silicon nitride layer and may be removed by wet etch, dry etch, or other suitable processes. Then, as shown in FIG. 15, another etch process may be performed to remove a portion of sidewalls of channel structure 112 exposed to cavity 160 to expose semiconductor channel 120 of channel structure 112 to form a cavity 161.

Figure 16:
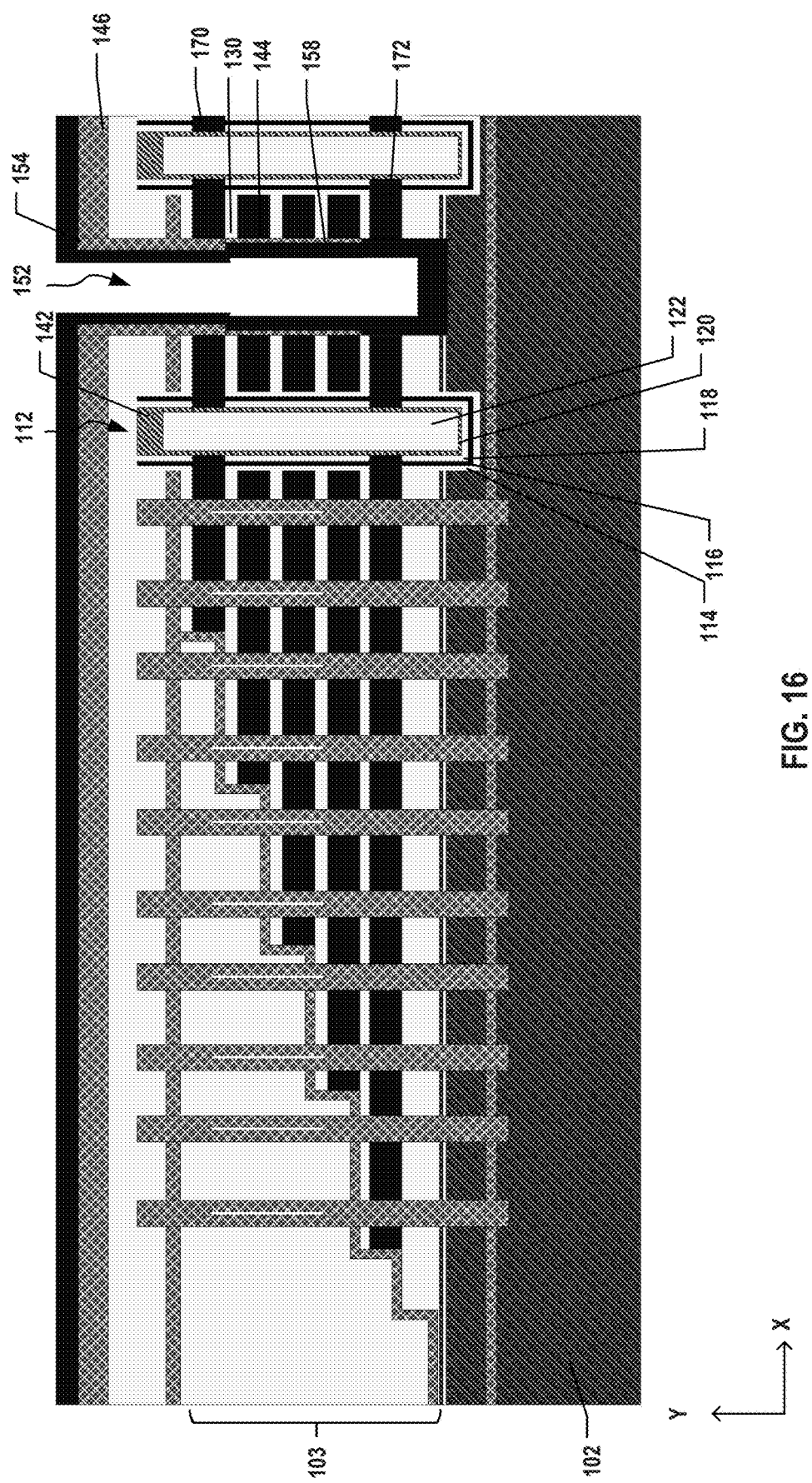
Figure 17:
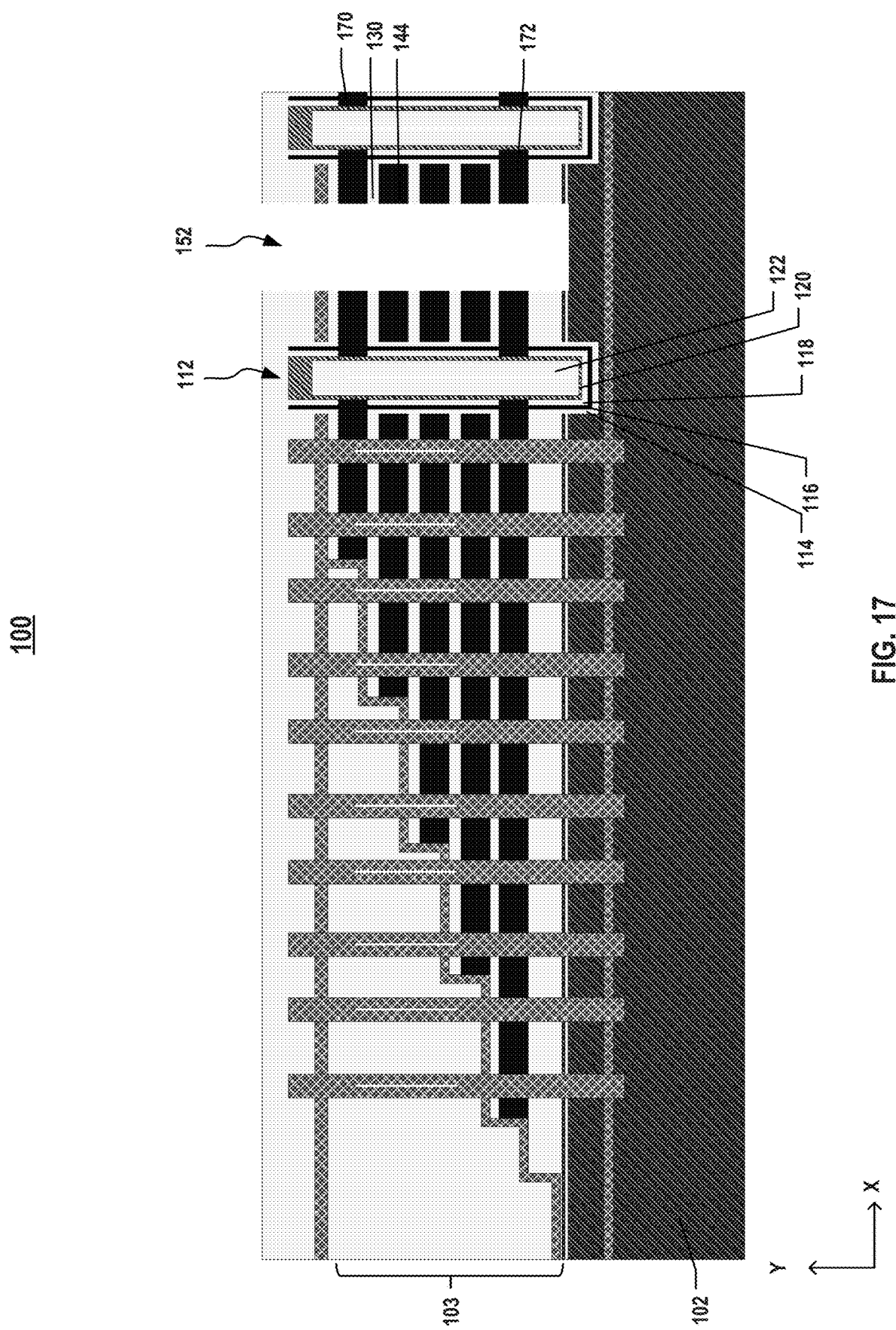

As shown in FIG. 16, a third sacrificial layer 172 is formed in cavity 161, on sidewalls of slit 152, and on the top surface of hard mask 146. In some implementations, third sacrificial layer 172 may be formed by the same material of sacrificial layers 144. In some implementations, third sacrificial layer 172 is a silicon nitride layer. In some implementations, third sacrificial layer 172 may be formed by ALD, PVD, CVD, or other suitable processes. Since a portion of the memory film is removed, third sacrificial layer 172 directly contacts semiconductor channel 120. As shown in FIG. 17, third sacrificial layer 172 on sidewalls of slit 152, and on the top surface of hard mask 146 is removed, and then spacer hard mask 154, spacer hard mask 158, and hard mask 146 are removed.

Figure 18:
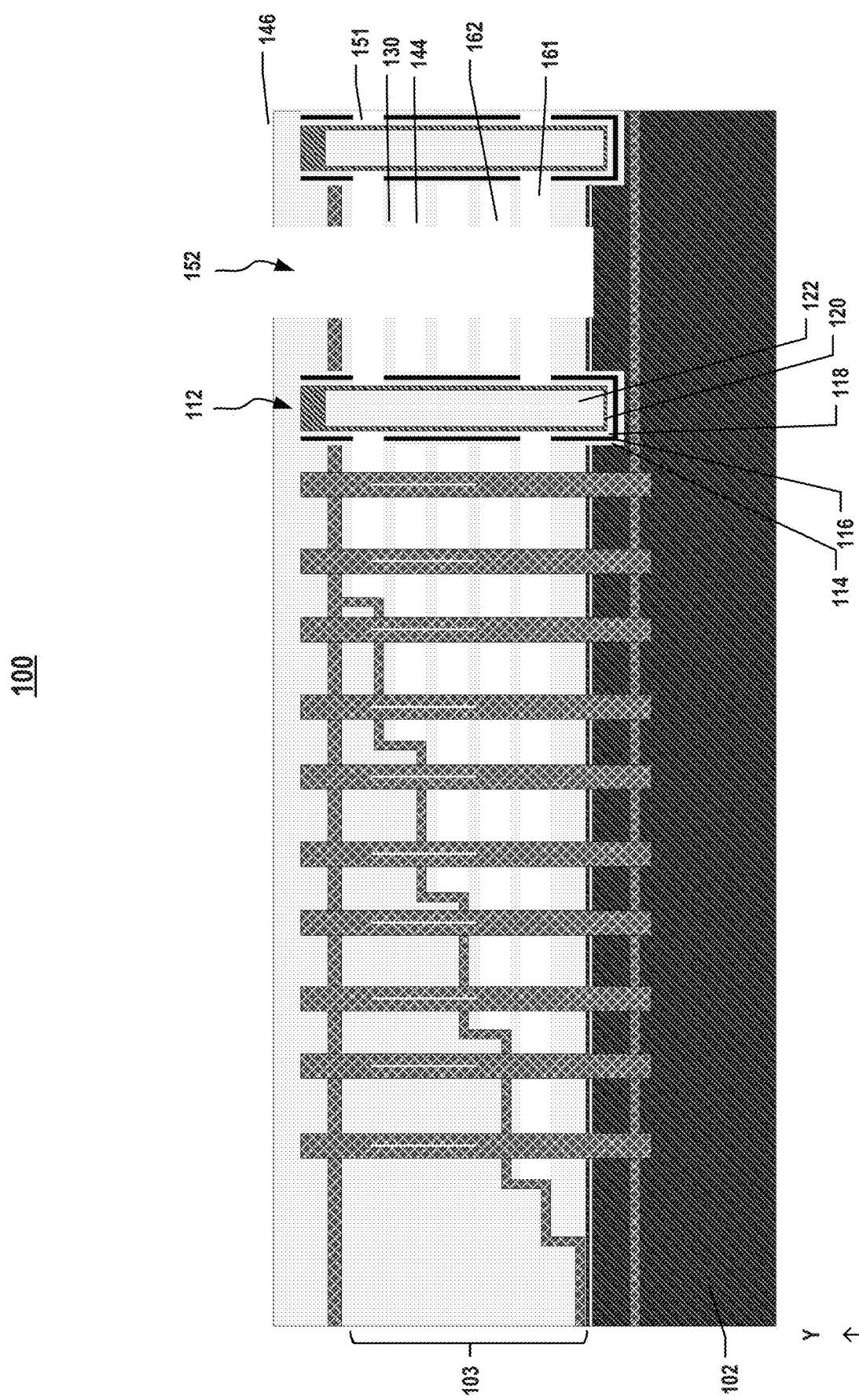

As shown in FIG. 18 and operation 216 in FIG. 21, sacrificial layers 144, second sacrificial layer 170, and third sacrificial layer 172 are removed to expose cavity 151 and cavity 161, and from cavities 162 in dielectric stack 103. In some implementations, sacrificial layers 144, second sacrificial layer 170, and third sacrificial layer 172 are silicon nitride layers and may be removed by wet etch, dry etch, or other suitable processes to expose cavity 151 and cavity 161, and from cavities 162.

Figure 19:
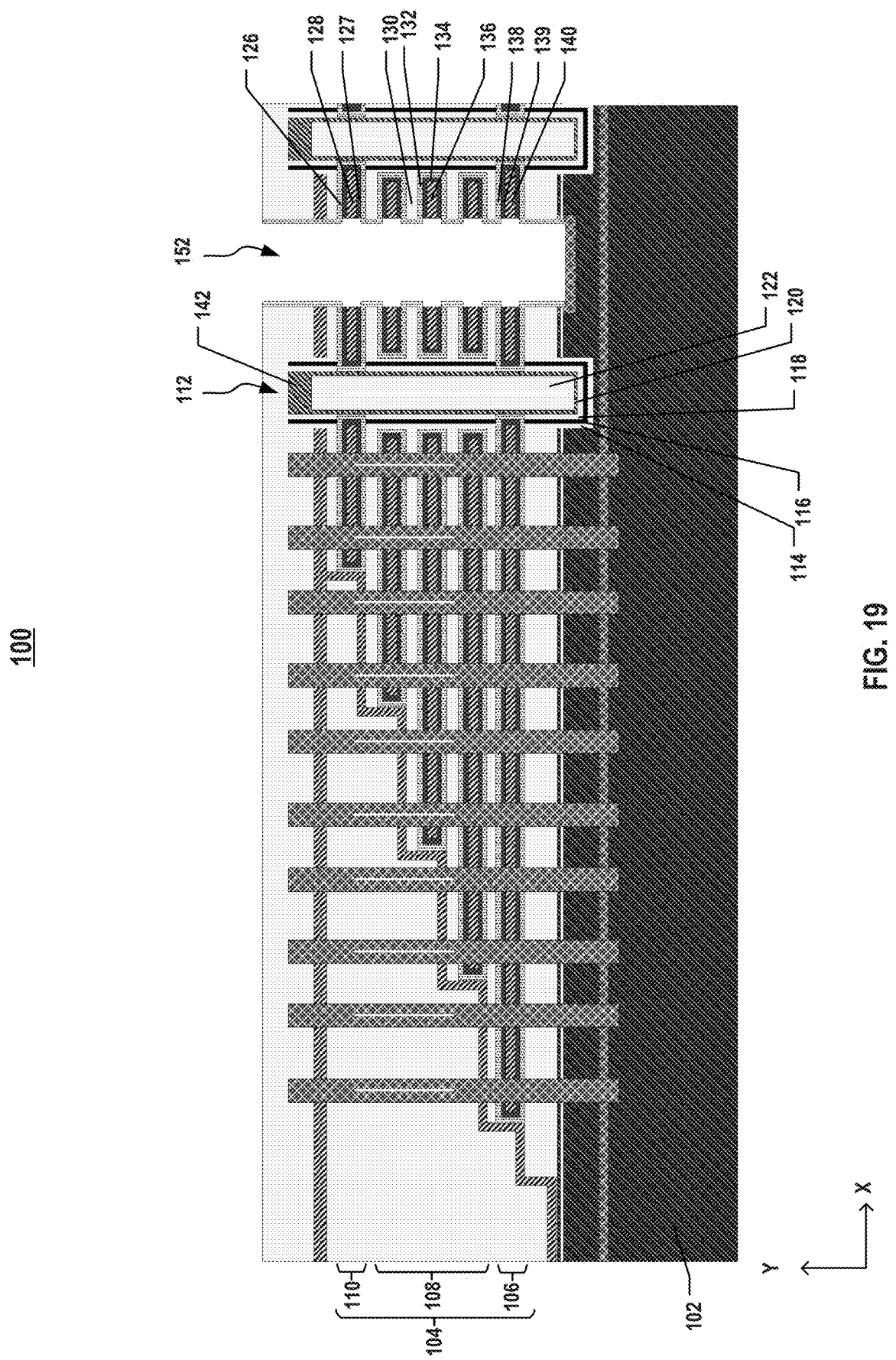

As shown in FIG. 19 and operation 218 in FIG. 21, drain select gate line 110 is formed in cavity 151, source select gate line 106 is formed in cavity 161, and word lines 108 are formed in cavities 162 in dielectric stack 103. Each word line 108 may include gate conductor 136, adhesion layer 134, and gate dielectric layer 132. Drain select gate line 110 may include conductor layer 128, adhesion layer 127, and dielectric layer 126. Source select gate line 106 may include conductor layer 140, adhesion layer 139, and dielectric layer 138.

In some implementations, gate dielectric layer 132, dielectric layer 126, and dielectric layer 138 are formed during the same process on sidewalls of cavity 151, cavity 161, and cavities 162. In some implementations, gate dielectric layer 132, dielectric layer 126, and dielectric layer 138 may be formed by the same material. In some implementations, gate dielectric layer 132, dielectric layer 126, and dielectric layer 138 may have the same thickness. Gate dielectric layer 132, dielectric layer 126, and dielectric layer 138 may include, but not limited to, aluminum oxide (AlO), high-k dielectric materials, or other suitable materials. In some implementations, gate dielectric layer 132, dielectric layer 126, and dielectric layer 138 may be formed by ALD, PVD, CVD, or other suitable processes.

In some implementations, adhesion layer 134, adhesion layer 127, and adhesion layer 139 are formed during the same process on gate dielectric layer 132, dielectric layer 126, and dielectric layer 138. In some implementations, adhesion layer 134, adhesion layer 127, and adhesion layer 139 may be formed by the same material. In some implementations, adhesion layer 134, adhesion layer 127, and adhesion layer 139 may have the same thickness. Adhesion layer 134, adhesion layer 127, and adhesion layer 139 may include, but not limited to, Ti/TiN or Ta/TaN. In some implementations, adhesion layer 134, adhesion layer 127, and adhesion layer 139 may be formed by ALD, PVD, CVD, or other suitable processes.

In some implementations, gate conductor 136, conductor layer 128, and conductor layer 140 are formed during the same process on adhesion layer 134, adhesion layer 127, and adhesion layer 139. In some implementations, gate conductor 136, conductor layer 128, and conductor layer 140 may be formed by the same material. Gate conductor 136, conductor layer 128, and conductor layer 140 may include conductive materials including, but not limited to, tungsten (W), cobalt (Co), copper (Cu), aluminum (Al), polysilicon, doped silicon, silicides, or any combination thereof. In some implementations, gate conductor 136, conductor layer 128, and conductor layer 140 may be formed by ALD, PVD, CVD, or other suitable processes.

Figure 20:
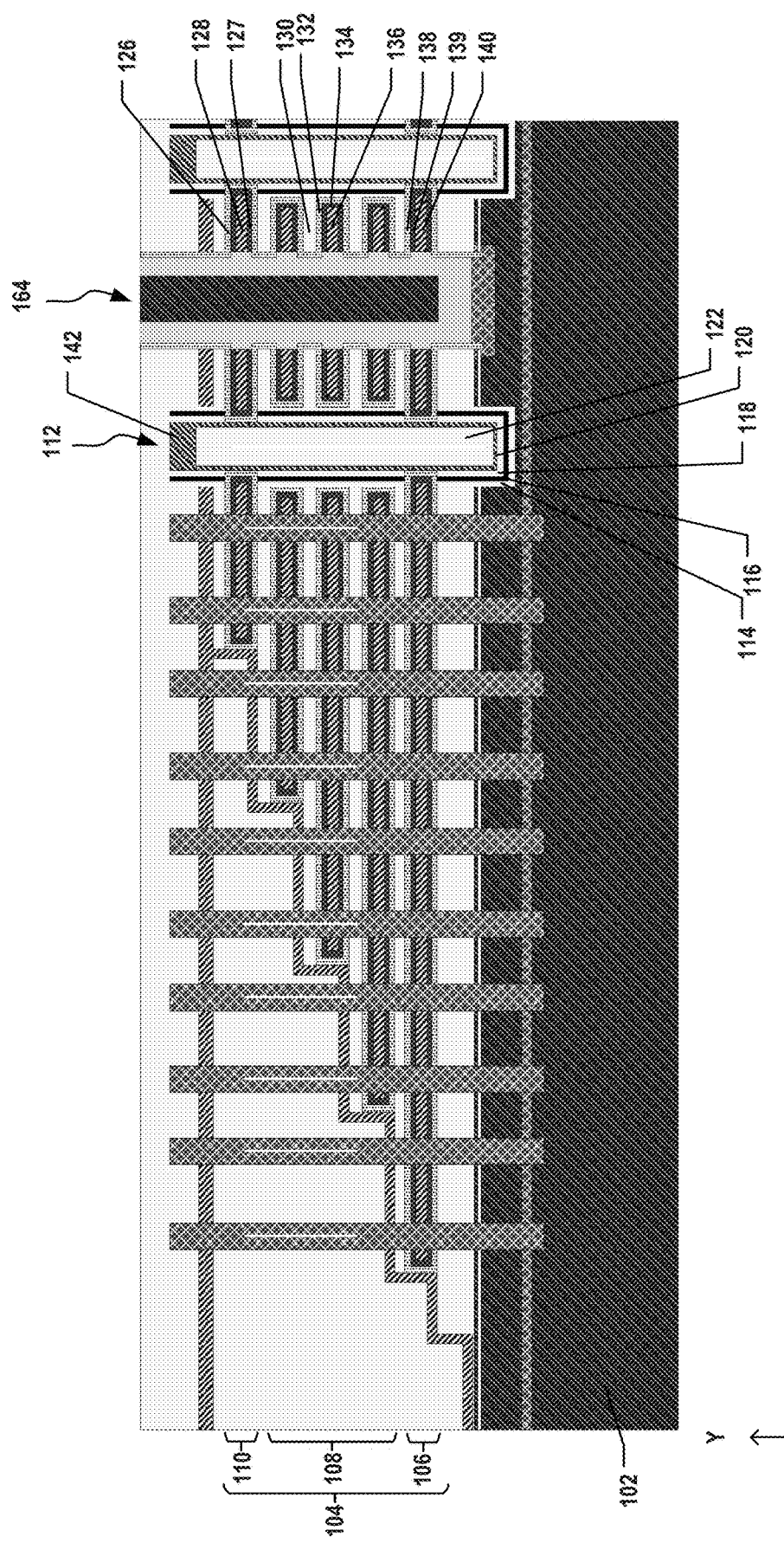
Figure 21:
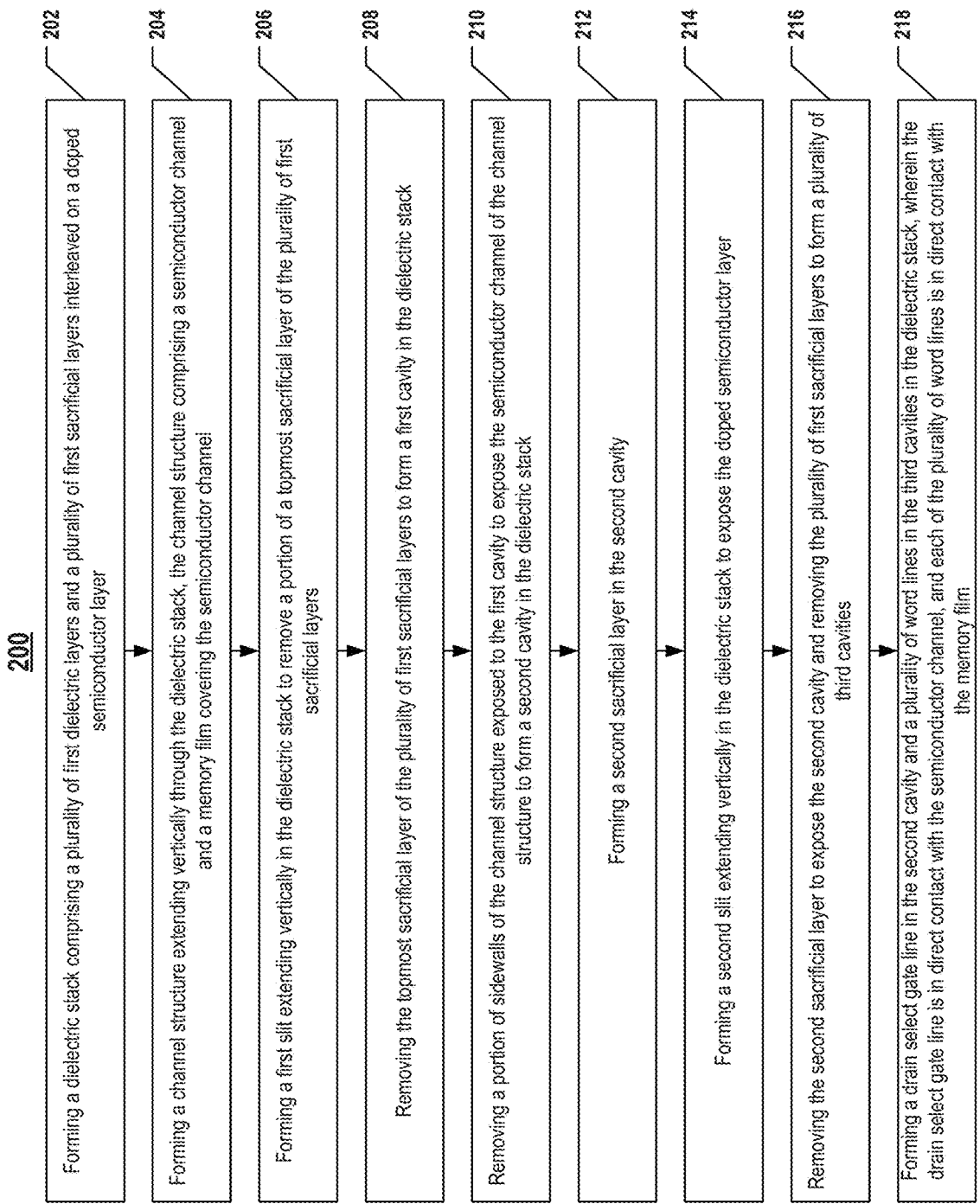
FIG. 21 illustrates a flowchart of an exemplary method for forming a 3D memory device, according to some aspects of the present disclosure.

As shown in FIG. 20, a gate line slit 164 is then formed to fill in second slit 152. In some implementations, the formation of gate line slit 164 may include forming a dielectric spacer layer on sidewalls of second slit 152, forming an adhesion layer on the dielectric spacer layer, forming a polysilicon layer on the adhesion layer, and forming a tungsten plug on the top of the polysilicon layer.

By removing a portion of the memory film on sidewalls of channel structure 112 to form drain select gate line 110 or source select gate line 106, the TSG transistor or the BSG transistor may function as a regular MOSFET, and the induced threshold voltage (Vt) shift of TSG transistor or the BSG transistor can be prevented.

Figure 22:
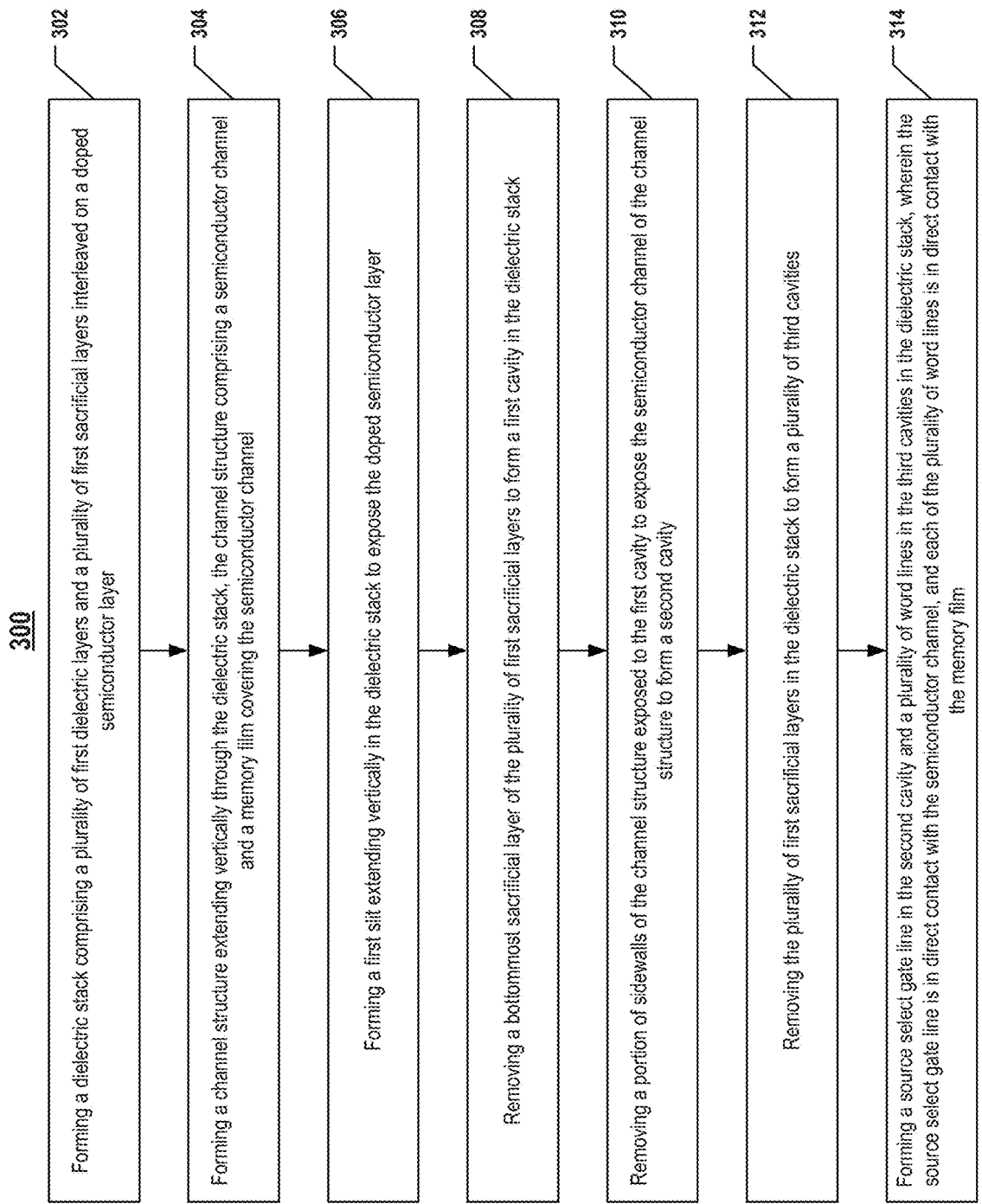
FIG. 22 illustrates a flowchart of another exemplary method for forming a 3D memory device, according to some aspects of the present disclosure.

FIG. 22 illustrates a flowchart of another exemplary method 300 for forming a 3D memory device, according to some aspects of the present disclosure. Method 300 describes the operations to form source select gate line 106 by removing a portion of the memory film on sidewalls of channel structure 112. As shown in operation 302 of FIG. 22 and FIG. 2, dielectric stack 103 including a plurality of dielectric/sacrificial layer pairs, including dielectric layers 130 and sacrificial layers 144, is formed on substrate 102. Then, as shown in operation 304 of FIG. 22 and FIG. 2, channel structure 112 extending vertically through dielectric stack 103 is formed.

As shown in operation 306 of FIG. 22, a slit extending vertically in dielectric stack 103 is formed to expose substrate 102. In method 300, because only source select gate line 106 is formed in the 3D memory device, the operations described in FIGS. 3-13 may be partially or optionally performed to form second slit 152 exposing substrate 102. Then, as shown in FIG. 14 and operation 308 of FIG. 22, bottommost sacrificial layer 156 in the plurality of dielectric/sacrificial layer pairs is removed to form cavity 160 in dielectric stack 103. Then, as shown in FIG. 15 and operation 310 of FIG. 22, another etch process may be performed to remove a portion of sidewalls of channel structure 112 exposed to cavity 160 to expose semiconductor channel 120 of channel structure 112 to form a cavity 161.

Third sacrificial layer 172 is formed in cavity 161, on sidewalls of slit 152, and on the top surface of hard mask 146, as shown in FIG. 16. Third sacrificial layer 172 on sidewalls of slit 152, and on the top surface of hard mask 146 is removed, and then spacer hard mask 154, spacer hard mask 158, and hard mask 146 are removed, as shown in FIG. 17.

In operation 312, sacrificial layers 144, second sacrificial layer 170, and third sacrificial layer 172 are removed to expose cavity 151 and cavity 161, and from cavities 162 in dielectric stack 103, as shown in FIG. 18. In operation 314, source select gate line 106 is formed in cavity 161, and word lines 108 are formed in cavities 162 in dielectric stack 103, as shown in FIG. 19. Each word line 108 may include gate conductor 136, adhesion layer 134, and gate dielectric layer 132. Source select gate line 106 may include conductor layer 140, adhesion layer 139, and dielectric layer 138.

Figure 23:
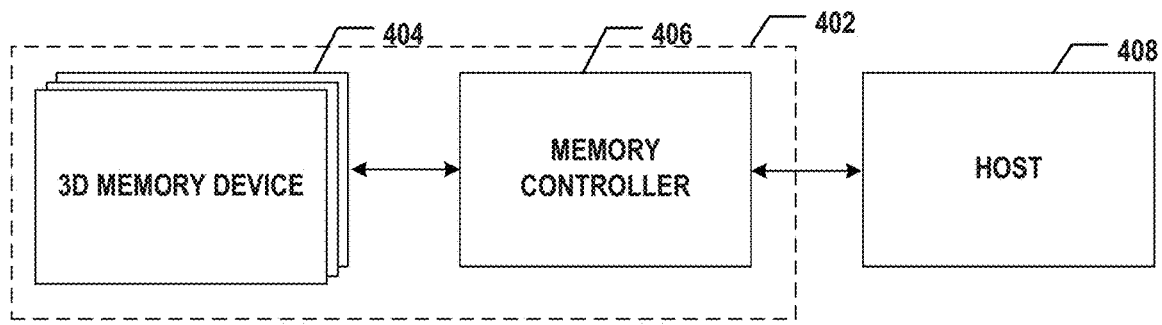
FIG. 23 illustrates a block diagram of an exemplary system having a memory device, according to some aspects of the present disclosure.

FIG. 23 illustrates a block diagram of an exemplary system 400 having a memory device, according to some aspects of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 23, system 400 can include a host 408 and a memory system 402 having one or more memory devices 404 and a memory controller 406. Host 408 can be a processor of an electronic device, such as a central processing unit (CPU), or a system-on-chip (SoC), such as an application processor (AP). Host 408 can be configured to send or receive data to or from memory devices 404.

Memory device 404 can be any memory device disclosed in the present disclosure. As disclosed above in detail, memory device 404, such as a NAND Flash memory device, may have a controlled and predefined discharge current in the discharge operation of discharging the bit lines. Memory controller 406 is coupled to memory device 404 and host 408 and is configured to control memory device 404, according to some implementations. Memory controller 406 can manage the data stored in memory device 404 and communicate with host 408. For example, memory controller 406 may be coupled to memory device 404, such as 3D memory device 100 described above, and memory controller 406 may be configured to control operations of channel structure 112 of 3D memory device 100 through drain select gate line 110 and/or select gate line 106. By using the polysilicon material to form drain select gate line 110 and/or source select gate line 106 in 3D memory device 100, the induced threshold voltage (Vt) shift of TSG transistor or the BSG transistor can be prevented. The reliability of memory device 404 can be therefore improved by preventing unpredictable failure caused by the induced threshold voltage (Vt) shift. As a result, the performance of system 400 can be improved.

In some implementations, memory controller 406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and program operations. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 is further configured to process error correction codes (ECCs) with respect to the data read from or written to memory device 404. Any other suitable functions may be performed by memory controller 406 as well, for example, formatting memory device 404. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 24A, 24B:
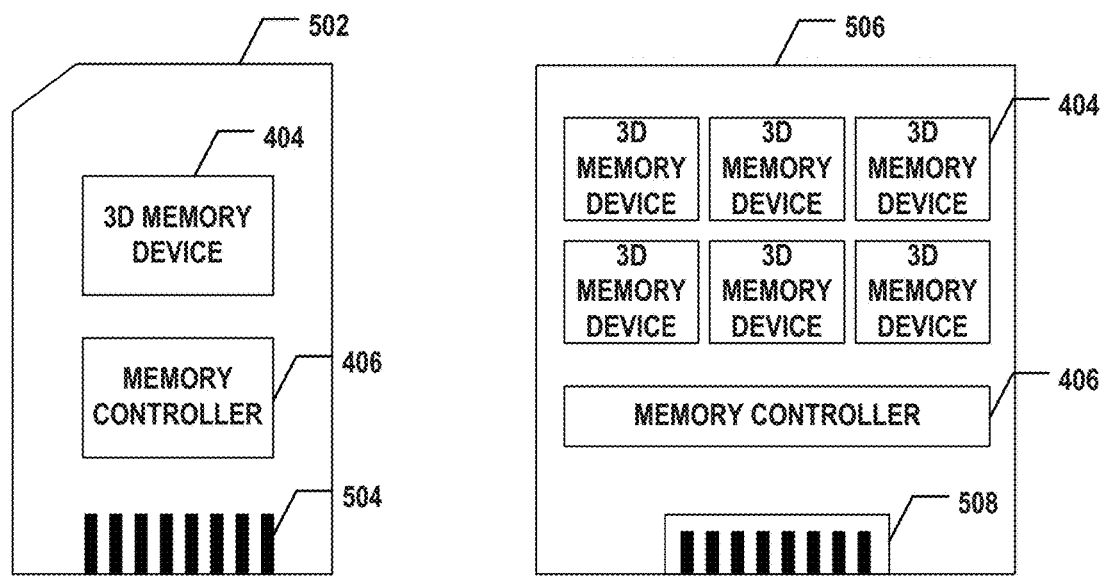
FIG. 24A illustrates a diagram of an exemplary memory card having a memory device, according to some aspects of the present disclosure.
FIG. 24B illustrates a diagram of an exemplary solid-state drive (SSD) having a memory device, according to some aspects of the present disclosure.

Memory controller 406 and one or more memory devices 404 can be integrated into various types of storage devices, for example, be included in the same package, such as a universal Flash storage (UFS) package or an eMMC package. That is, memory system 402 can be implemented and packaged into different types of end electronic products. In one example as shown in FIG. 24A, memory controller 406 and a single memory device 404 may be integrated into a memory card 502. Memory card 502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 502 can further include a memory card connector 504 coupling memory card 502 with a host (e.g., host 408 in FIG. 23). In another example as shown in FIG. 24B, memory controller 406 and multiple memory devices 404 may be integrated into an SSD 506. SSD 506 can further include an SSD connector 508 coupling SSD 506 with a host (e.g., host 408 in FIG. 23). In some implementations, the storage capacity and/or the operation speed of SSD 506 is greater than those of memory card 502.

According to one aspect of the present disclosure, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The channel structure includes a semiconductor channel, and a memory film over the semiconductor channel. The drain select gate line is in direct contact with the semiconductor channel, each of the plurality of word lines is in direct contact with the memory film, and the drain select gate line and the plurality of word lines comprise a same material.

In some implementations, the drain select gate line includes a first dielectric layer and a first conductive layer in contact with the first dielectric layer, and the first dielectric layer is in direct contact with the semiconductor channel. In some implementations, each of the plurality of word lines includes a second dielectric layer and a second conductive layer in contact with the second dielectric layer, the second dielectric layer is in direct contact with the memory film, and the first dielectric layer and the second dielectric layer are deposited during a same process.

In some implementations, the first dielectric layer and the second dielectric layer include a same material. In some implementations, the first dielectric layer and the second dielectric layer have a same thickness. In some implementations, the first conductive layer and the second conductive layer include a same material.

In some implementations, the memory film includes a tunneling layer over the semiconductor channel, a storage layer over the tunneling layer, and a blocking layer over the storage layer. The semiconductor channel, the tunneling layer, the storage layer, and the blocking layer are stacked along a second direction perpendicular to the first direction, the first dielectric layer is in direct contact with the semiconductor channel, and the second dielectric layer is in direct contact with the blocking layer.

In some implementations, the conductive layers further include a source select gate line, and the source select gate line comprises a third dielectric layer in direct contact with the semiconductor channel.

According to another aspect of the present disclosure, a 3D memory device is disclosed. The 3D memory device includes a doped semiconductor layer, a stack structure, and a channel structure. The stack structure includes interleaved conductive layers and dielectric layers formed on the doped semiconductor layer. The conductive layers include a plurality of word lines, and a source select gate line. The channel structure extends through the stack structure along a first direction and is in contact with the doped semiconductor layer. The channel structure includes a semiconductor channel, and a memory film over the semiconductor channel. The source select gate line is in direct contact with the semiconductor channel, each of the plurality of word lines is in direct contact with the memory film, and the source select gate line and the plurality of word lines include a same material.

In some implementations, the source select gate line includes a first dielectric layer and a first conductive layer in contact with the first dielectric layer, and the first dielectric layer is in direct contact with the semiconductor channel. In some implementations, each of the plurality of word lines includes a second dielectric layer and a second conductive layer in contact with the second dielectric layer, the second dielectric layer is in direct contact with the memory film, and the first dielectric layer and the second dielectric layer are deposited during a same process.

In some implementations, the first dielectric layer and the second dielectric layer include a same material. In some implementations, the first dielectric layer and the second dielectric layer have a same thickness. In some implementations, the first conductive layer and the second conductive layer include a same material.

In some implementations, the memory film includes a tunneling layer over the semiconductor channel, a storage layer over the tunneling layer, and a blocking layer over the storage layer. The semiconductor channel, the tunneling layer, the storage layer, and the blocking layer are stacked along a second direction perpendicular to the first direction, the first dielectric layer is in direct contact with the semiconductor channel, and the second dielectric layer is in direct contact with the blocking layer.

In some implementations, the conductive layers further include a drain select gate line, and the drain select gate line comprises a third dielectric layer in direct contact with the semiconductor channel.

According to still another aspect of the present disclosure, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a plurality of word lines, and a drain select gate line. The channel structure extends through the stack structure along a first direction and is in contact with the doped semiconductor layer. The channel structure includes a semiconductor channel, and a memory film over the semiconductor channel. The drain select gate line is in direct contact with the semiconductor channel, each of the plurality of word lines is in direct contact with the memory film, and the drain select gate line and the plurality of word lines include a same material. The memory controller is coupled to the 3D memory device and is configured to control operations of the channel structure through the drain select gate line.

According to yet another aspect of the present disclosure, a system is disclosed. The system includes a 3D memory device configured to store data and a memory controller. The 3D memory device includes a doped semiconductor layer, a stack structure, and a channel structure. The stack structure includes interleaved conductive layers and dielectric layers formed on the doped semiconductor layer. The conductive layers include a plurality of word lines, and a source select gate line. The channel structure extends through the stack structure along a first direction and is in contact with the doped semiconductor layer. The channel structure includes a semiconductor channel, and a memory film over the semiconductor channel. The source select gate line is in direct contact with the semiconductor channel, each of the plurality of word lines is in direct contact with the memory film, and the source select gate line and the plurality of word lines include a same material. The memory controller is coupled to the 3D memory device and is configured to control operations of the channel structure through the source select gate line.

According to yet another aspect of the present disclosure, a method for forming a 3D memory device is disclosed. A dielectric stack including a plurality of first dielectric layers and a plurality of first sacrificial layers interleaved on a doped semiconductor layer is formed. A channel structure extending vertically through the dielectric stack is formed, and the channel structure includes a semiconductor channel and a memory film covering the semiconductor channel. A first slit extending vertically in the dielectric stack is formed to remove a portion of a topmost sacrificial layer of the plurality of first sacrificial layers. The topmost sacrificial layer of the plurality of first sacrificial layers is removed to form a first cavity in the dielectric stack. A portion of sidewalls of the channel structure exposed to the first cavity is removed to expose the semiconductor channel of the channel structure to form a second cavity in the dielectric stack. A second sacrificial layer is formed in the second cavity. A second slit extending vertically in the dielectric stack is formed to expose the doped semiconductor layer. The second sacrificial layer is removed to expose the second cavity, and the plurality of first sacrificial layers are removed to form a plurality of third cavities. A drain select gate line is formed in the second cavity, and a plurality of word lines are formed in the third cavities in the dielectric stack. The drain select gate line is in direct contact with the semiconductor channel, and each of the plurality of word lines is in direct contact with the memory film.

In some implementations, the memory film includes a tunneling layer over the semiconductor channel, a storage layer over the tunneling layer, and a blocking layer over the storage layer. In some implementations, the blocking layer, the storage layer, and the tunneling layer of the channel structure exposed to the first cavity are removed, and the semiconductor channel is exposed. In some implementations, the second sacrificial layer is formed in the first cavity directly contacting the semiconductor channel.

In some implementations, a protection layer is formed on sidewalls of the first slit, and a portion of the dielectric stack is removed to extend the first slit until exposing the doped semiconductor layer. In some implementations, removing the second sacrificial layer to expose the second cavity and removing the plurality of first sacrificial layers to form the plurality of third cavities are performed during a same process.

In some implementations, a second dielectric layer is formed on sidewalls of the second cavity and sidewalls of the plurality of third cavities, and a first conductive layer is formed in the second cavity and the plurality of third cavities in contact with the second dielectric layer. The second dielectric layer is in direct contact with the semiconductor channel in the second cavity, and the second dielectric layer is in direct contact with the blocking layer in the plurality of third cavities.

In some implementations, the second dielectric layer on sidewalls of the second cavity and sidewalls of the plurality of third cavities is formed during a same process. In some implementations, the second dielectric layer on sidewalls of the second cavity and sidewalls of the plurality of third cavities has a same thickness.

According to yet another aspect of the present disclosure, a method for forming a 3D memory device is disclosed. A dielectric stack including a plurality of first dielectric layers and a plurality of first sacrificial layers interleaved on a doped semiconductor layer is formed. A channel structure extending vertically through the dielectric stack is formed, and the channel structure includes a semiconductor channel and a memory film covering the semiconductor channel. A first slit extending vertically in the dielectric stack is formed to expose the doped semiconductor layer. A bottommost sacrificial layer of the plurality of first sacrificial layers is removed to form a first cavity in the dielectric stack. A portion of sidewalls of the channel structure exposed to the first cavity is removed to expose the semiconductor channel of the channel structure to form a second cavity. The plurality of first sacrificial layers in the dielectric stack are removed to form a plurality of third cavities. A source select gate line is formed in the second cavity, and a plurality of word lines are formed in the third cavities in the dielectric stack. The source select gate line is in direct contact with the semiconductor channel, and each of the plurality of word lines is in direct contact with the memory film.

In some implementations, the first slit is formed extending vertically in the dielectric stack until exposing a dielectric layer above the bottommost sacrificial layer, a protection layer is formed on sidewalls of the first slit, and the first slit is vertically extended to expose the doped semiconductor layer. In some implementations, a second sacrificial layer is formed in the second cavity, and the protection layer is removed from the sidewalls of the first slit.

In some implementations, the memory film includes a tunneling layer over the semiconductor channel, a storage layer over the tunneling layer, and a blocking layer over the storage layer. In some implementations, the blocking layer, the storage layer, and the tunneling layer of the channel structure exposed to the first cavity are removed, and the semiconductor channel is exposed.

In some implementations, a second dielectric layer is formed on sidewalls of the second cavity and sidewalls of the plurality of third cavities, and a first conductive layer is formed in the second cavity and the plurality of third cavities in contact with the second dielectric layer. The second dielectric layer is in direct contact with the semiconductor channel in the second cavity, and the second dielectric layer is in direct contact with the blocking layer in the plurality of third cavities.

In some implementations, the second dielectric layer on sidewalls of the second cavity and sidewalls of the plurality of third cavities is formed during a same process. In some implementations, the second dielectric layer on sidewalls of the second cavity and sidewalls of the plurality of third cavities has a same thickness.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a doped semiconductor layer;
a stack structure comprising interleaved conductive layers and dielectric layers formed on the doped semiconductor layer, the conductive layers comprising a plurality of word lines, and a drain select gate line; and
a channel structure extending through the stack structure along a first direction and in contact with the doped semiconductor layer, the channel structure comprising a semiconductor channel, and a memory film over the semiconductor channel,
wherein the drain select gate line is in direct contact with the semiconductor channel, each of the plurality of word lines is in direct contact with the memory film, and the drain select gate line and the plurality of word lines comprise a same material.

2. The 3D memory device of claim 1, wherein the drain select gate line comprises a first dielectric layer and a first conductive layer in contact with the first dielectric layer, and the first dielectric layer is in direct contact with the semiconductor channel.

3. The 3D memory device of claim 2, wherein each of the plurality of word lines comprises a second dielectric layer and a second conductive layer in contact with the second dielectric layer, the second dielectric layer is in direct contact with the memory film, and the first dielectric layer and the second dielectric layer are deposited during a same process.

4. The 3D memory device of claim 3, wherein the first dielectric layer and the second dielectric layer comprise a same material.

5. The 3D memory device of claim 3, wherein the first dielectric layer and the second dielectric layer have a same thickness.

6. The 3D memory device of claim 3, wherein the first conductive layer and the second conductive layer comprise a same material.

7. The 3D memory device of claim 3, wherein the memory film comprises:
- a tunneling layer over the semiconductor channel;
- a storage layer over the tunneling layer; and
- a blocking layer over the storage layer,
- wherein the semiconductor channel, the tunneling layer, the storage layer, and the blocking layer are stacked along a second direction perpendicular to the first direction, the first dielectric layer is in direct contact with the semiconductor channel, and the second dielectric layer is in direct contact with the blocking layer.

8. The 3D memory device of claim 1, wherein the conductive layers further comprise a source select gate line, and the source select gate line comprises a third dielectric layer in direct contact with the semiconductor channel.

9. A three-dimensional (3D) memory device, comprising:
- a doped semiconductor layer;
- a stack structure comprising interleaved conductive layers and dielectric layers formed on the doped semiconductor layer, the conductive layers comprising a plurality of word lines, and a source select gate line; and
- a channel structure extending through the stack structure along a first direction and in contact with the doped semiconductor layer, and the channel structure comprising a semiconductor channel, and a memory film over the semiconductor channel,
- wherein the source select gate line is in direct contact with the semiconductor channel, each of the plurality of word lines is in direct contact with the memory film, and the source select gate line and the plurality of word lines comprise a same material.

10. The 3D memory device of claim 9, wherein the source select gate line comprises a first dielectric layer and a first conductive layer in contact with the first dielectric layer, and the first dielectric layer is in direct contact with the semiconductor channel.

11. The 3D memory device of claim 10, wherein each of the plurality of word lines comprises a second dielectric layer and a second conductive layer in contact with the second dielectric layer, the second dielectric layer is in direct contact with the memory film, and the first dielectric layer and the second dielectric layer are deposited during a same process.

12. The 3D memory device of claim 11, wherein the first dielectric layer and the second dielectric layer comprise a same material.

13. The 3D memory device of claim 11, wherein the first dielectric layer and the second dielectric layer have a same thickness.

14. The 3D memory device of claim 11, wherein the first conductive layer and the second conductive layer comprise a same material.

15. The 3D memory device of claim 11, wherein the memory film comprises:
- a tunneling layer over the semiconductor channel;
- a storage layer over the tunneling layer; and
- a blocking layer over the storage layer,
- wherein the semiconductor channel, the tunneling layer, the storage layer, and the blocking layer are stacked along a second direction perpendicular to the first direction, the first dielectric layer is in direct contact with the semiconductor channel, and the second dielectric layer is in direct contact with the blocking layer.

16. The 3D memory device of claim 9, wherein the conductive layers further comprise a drain select gate line, and the drain select gate line comprises a third dielectric layer in direct contact with the semiconductor channel.

* * * * *